United States Patent
Ikedo et al.

(10) Patent No.: US 11,184,569 B2
(45) Date of Patent: Nov. 23, 2021

(54) IMAGE SENSOR AND IMAGE CAPTURING APPARATUS

(71) Applicant: CANON KABUSHIKI KAISHA, Tokyo (JP)

(72) Inventors: Hideki Ikedo, Kawasaki (JP); Hirokazu Kobayashi, Tokyo (JP)

(73) Assignee: CANON KABUSHIKI KAISHA, Tokyo (JP)

(*) Notice: Subject to any disclaimer, the term of this patent is extended or adjusted under 35 U.S.C. 154(b) by 61 days.

(21) Appl. No.: 16/691,229

(22) Filed: Nov. 21, 2019

(65) Prior Publication Data

US 2020/0169684 A1 May 28, 2020

(30) Foreign Application Priority Data

Nov. 27, 2018 (JP) .............................. JP2018-221680

(51) Int. Cl.
*H04N 5/3745* (2011.01)
*H04N 5/376* (2011.01)
(Continued)

(52) U.S. Cl.
CPC ........ *H04N 5/37455* (2013.01); *H03M 1/123* (2013.01); *H04N 5/36961* (2018.08);
(Continued)

(58) Field of Classification Search
CPC .......... H04N 5/37455; H04N 5/36961; H03M 1/123
See application file for complete search history.

(56) References Cited

U.S. PATENT DOCUMENTS 5,461,425 A * 10/1995 Fowler ................. H04N 5/3742
348/294
6,377,303 B2 * 4/2002 O'Connor .......... H04N 5/37455
348/308
(Continued)

FOREIGN PATENT DOCUMENTS

JP 2001-083407 A 3/2001
WO 2016/136448 A1 9/2016

OTHER PUBLICATIONS

L. G. McIlrath, "A low-power low-noise ultrawide-dynamic-range CMOS imager with pixel-parallel A/D conversion," in IEEE Journal of Solid-State Circuits, vol. 36, No. 5, pp. 846-853, May 2001, doi: 10.1109/4.918924. (Year: 2001).*

*Primary Examiner* — John Villecco
(74) *Attorney, Agent, or Firm* — Cowan, Liebowitz & Latman, P.C.

(57) ABSTRACT

An image sensor comprises: a plurality of pixels, each pixel including a light-receiving portion that outputs an electrical signal obtained by photoelectrically converting incident light and an A/D converter that AD-converts the electrical signal, the plurality of pixels configured to be capable of AD-converting a signal output from the light-receiving portion of a first pixel, among a predetermined plurality of pixels, using the A/D converter of another pixel, every predetermined plurality of pixels; and a selection circuit that selects a pixel to AD-convert the electrical signal output from the light-receiving portion of the first pixel, every predetermined plurality of pixels. The A/D converters of the predetermined plurality of pixels carry out the AD conversion in parallel.

11 Claims, 27 Drawing Sheets

(51) Int. Cl.
*H04N 5/378* (2011.01)
*H04N 5/369* (2011.01)
*H03M 1/12* (2006.01)
*H03M 1/50* (2006.01)

(52) U.S. Cl.
CPC ........... *H04N 5/378* (2013.01); *H04N 5/3765* (2013.01); *H03M 1/50* (2013.01)

(56) References Cited

U.S. PATENT DOCUMENTS

| | | | | |
|---|---|---|---|---|
| 6,927,796 | B2* | 8/2005 | Liu | H04N 5/37455 |
| | | | | 348/297 |
| 7,911,520 | B2* | 3/2011 | Shigematsu | H04N 5/355 |
| | | | | 348/300 |
| 9,270,895 | B2* | 2/2016 | Kelly | H04N 5/23254 |
| 9,615,038 | B2* | 4/2017 | Kelly | H04N 5/35572 |
| 9,641,780 | B2* | 5/2017 | Ishiwata | H04N 5/36961 |
| 9,743,024 | B2* | 8/2017 | Tyrrell | H04N 5/335 |
| 9,967,492 | B2* | 5/2018 | Kobayashi | H04N 5/37455 |
| 9,986,194 | B2* | 5/2018 | Maehashi | H04N 5/66 |
| 10,079,984 | B2* | 9/2018 | Kelly | H04N 5/23267 |
| 10,142,575 | B2* | 11/2018 | Meynants | H01L 27/14636 |
| 10,250,831 | B2* | 4/2019 | Tyrrell | H04N 5/335 |
| 10,298,216 | B2* | 5/2019 | Harada | H04N 5/374 |
| 10,547,802 | B2* | 1/2020 | Sakakibara | H04N 5/35563 |
| 10,616,520 | B2* | 4/2020 | Tyrrell | H04N 5/37455 |
| 10,694,122 | B2* | 6/2020 | Kelly | H04N 5/2355 |
| 10,903,385 | B2* | 1/2021 | Miyamoto | H04N 5/37455 |
| 2010/0302407 | A1* | 12/2010 | Ayers | H04N 5/37455 |
| | | | | 348/230.1 |
| 2015/0124139 | A1* | 5/2015 | Ishiwata | H01L 27/14643 |
| | | | | 348/308 |
| 2015/0189249 | A1* | 7/2015 | Hiyama | H04N 5/347 |
| | | | | 348/281 |
| 2018/0184036 | A1* | 6/2018 | Sato | G02B 7/34 |
| 2020/0252563 | A1* | 8/2020 | Yasuda | H04N 5/343 |
| 2020/0260030 | A1* | 8/2020 | Sakakibara | H04N 5/37455 |
| 2020/0260043 | A1* | 8/2020 | Seo | H04N 5/37457 |
| 2020/0396401 | A1* | 12/2020 | Chu | H04N 5/3559 |
| 2021/0091129 | A1* | 3/2021 | Kim | H01L 27/14636 |
| 2021/0092313 | A1* | 3/2021 | Sakakibara | H04N 5/3742 |

* cited by examiner

FIG. 2
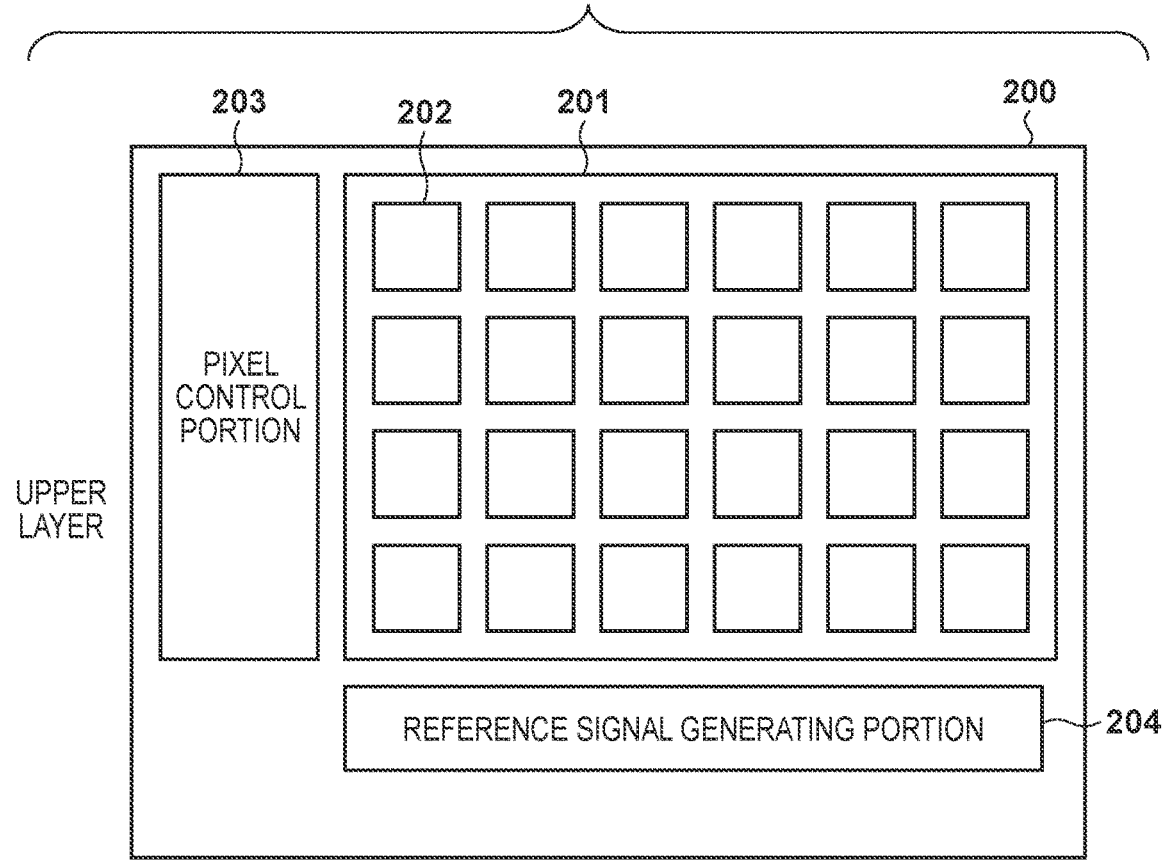
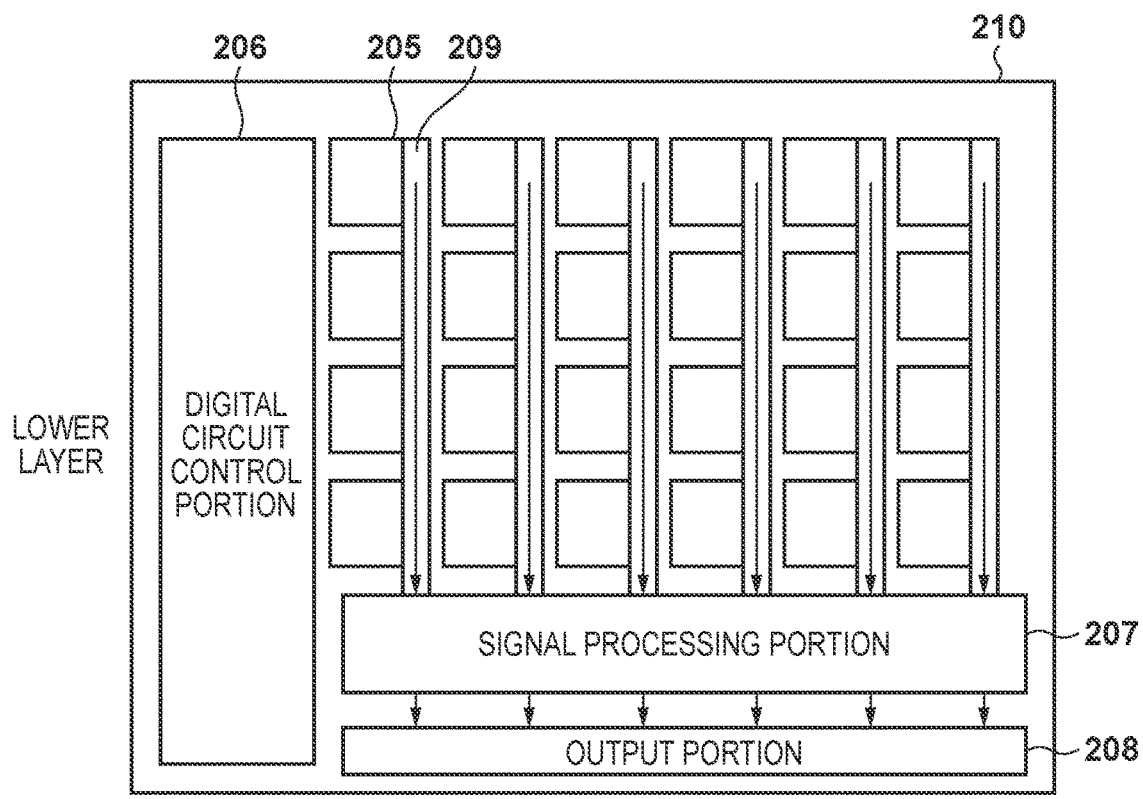

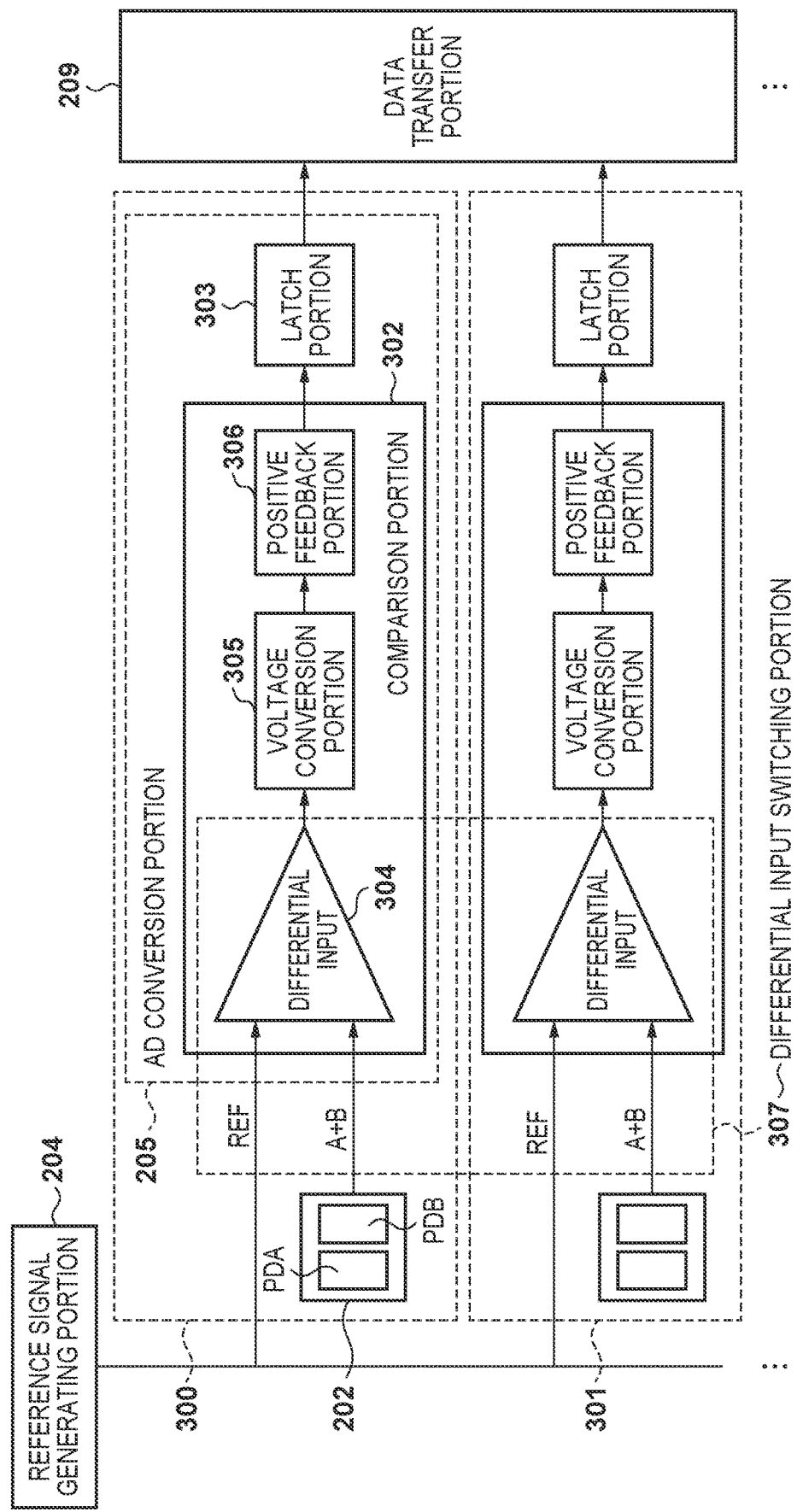

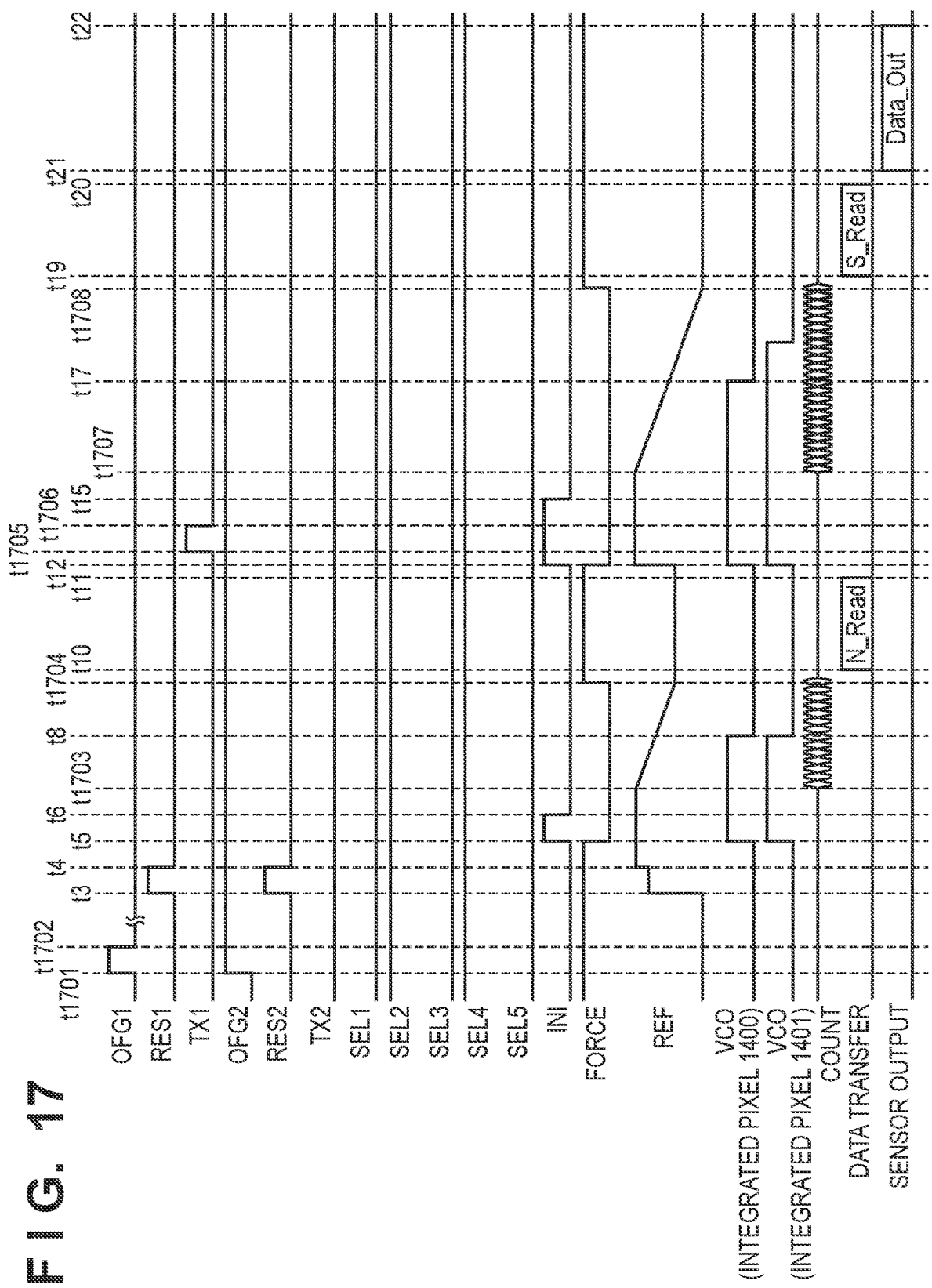

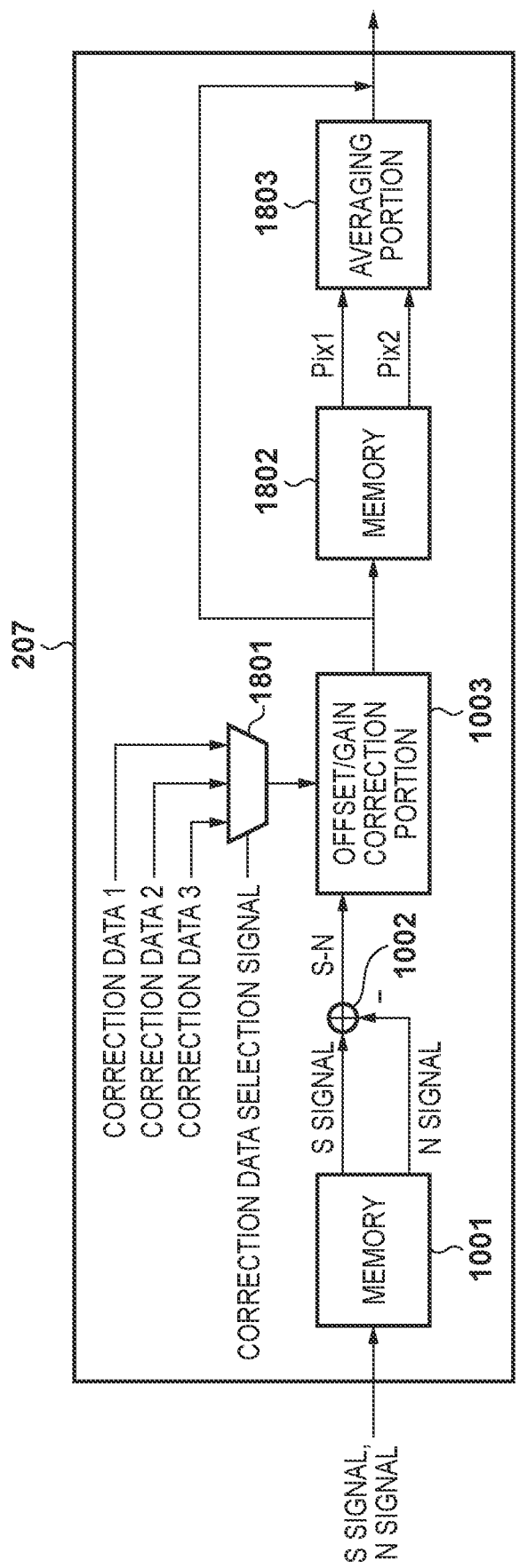

IMAGE SENSOR AND IMAGE CAPTURING APPARATUS

BACKGROUND OF THE INVENTION

Field of the Invention

The present invention relates to an image sensor and an image capturing apparatus, and particularly relates to an image sensor including an AD conversion portion in each pixel and an image capturing apparatus.

Description of the Related Art

As an analog-digital (AD) conversion method for image capturing apparatuses, International Publication No. WO 2016/136448 proposes an AD conversion method in which a comparator which compares a pixel signal from each of pixels with a slope-type reference signal is connected to a latch portion for holding a digital count value as a pixel signal in a later stage. According to the configuration disclosed in International Publication No. WO 2016/136448, global shutter operations can be carried out by carrying out exposure and AD conversion for all the pixels simultaneously. According to this configuration, a charge holding portion for holding a charge need not be provided in each pixel in order to carry out the global shutter operations.

On the other hand, Japanese Patent Laid-Open No. 2001-083407 discloses a technique pertaining to an image capturing apparatus capable of pupil division-based focus detection. According to Japanese Patent Laid-Open No. 2001-083407, each pixel in an image sensor is constituted by two photoelectric conversion portions, with the photoelectric conversion portions being configured to receive light passing through different pupils of a shooting lens using a single microlens. The two photoelectric conversion portions are connected to a common floating diffusion region via respective transfer transistors. As a result, signals based on the signal charges of one or both of the photoelectric conversion portions, which have been transferred to the floating diffusion region, can be output from a common readout circuit.

Focus detection of the shooting lens can be carried out by comparing the signals obtained from the two photoelectric conversion portions, while the signal of a shot image can be obtained by adding the signals from the two photoelectric conversion portions and outputting the resulting signal.

Here, consider a situation where the pixel configuration described in Japanese Patent Laid-Open No. 2001-083407 is applied in an image capturing apparatus including an AD conversion portion in each pixel as per International Publication No. WO 2016/136448, or in other words, a situation where a single pixel is constituted by two photoelectric conversion portions and a single AD conversion portion serving as a common readout circuit. Note that the two photoelectric conversion portions and the common AD conversion portion will together be called an "integrated pixel" hereinafter. In this case, if signals are sequentially AD-converted and read out from the two photoelectric conversion portions in the integrated pixel when the apparatus is in a readout mode for performing focus detection, a difference will arise between the accumulation timings of the two signals. This leads to, for example, a drop in the performance of focus detection on a moving object.

On the other hand, if a single pixel is constituted by two photoelectric conversion portions and two AD conversion portions, the surface area of the circuitry of the AD conversion portions will increase, which makes it difficult to arrange the AD conversion portions within the limit area of the integrated pixel. In particular, the latch portion for holding the pixel signal normally requires around a dozen of transistors to be provided for each bit. For example, adding a 14-bit latch portion increases the number of transistors by several hundred, which makes a broad circuit area necessary. Furthermore, the second AD conversion portion is not needed in a readout mode where only a single pixel signal is output for each integrated pixel, such as a normal still image shooting mode, and the portion is therefore redundant.

SUMMARY OF THE INVENTION

The present invention has been made in consideration of the above situation, and makes it possible, in an image capturing apparatus including an AD conversion portion for each pixel, to quickly and flexibly AD-convert signals from each pixel while suppressing a major increase in the circuit scale.

According to the present invention, provided is an image sensor comprising: a plurality of pixels, each pixel including a light-receiving portion that outputs an electrical signal obtained by photoelectrically converting incident light and an A/D converter that AD-converts the electrical signal, the plurality of pixels configured to be capable of AD-converting a signal output from the light-receiving portion of a first pixel, among a predetermined plurality of pixels, using the A/D converter of another pixel, every predetermined plurality of pixels; and a selection circuit that selects a pixel to AD-convert the electrical signal output from the light-receiving portion of the first pixel, every predetermined plurality of pixels, wherein the A/D converters of the predetermined plurality of pixels carry out the AD conversion in parallel.

Further, according to the present invention, provided is an image capturing apparatus comprising: an image sensor including a plurality of pixels and a selection circuit, each pixel including a light-receiving portion that outputs an electrical signal obtained by photoelectrically converting incident light and an A/D converter that AD-converts the electrical signal, the plurality of pixels configured to be capable of AD-converting a signal output from the light-receiving portion of a first pixel, among a predetermined plurality of pixels, using the A/D converter of another pixel, every predetermined plurality of pixels, and the selection circuit selecting a pixel to AD-convert the electrical signal output from the light-receiving portion of the first pixel every predetermined plurality of pixels; and a processing circuit that processes a digital signal output from the A/D converter of each pixel, wherein the A/D converters of the predetermined plurality of pixels carry out the AD conversion in parallel.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

FIG. 2 is a diagram schematically illustrating a configuration of an image sensor according to embodiments.

FIGS. 3A to 3C are diagrams schematically illustrating a configuration of an integrated pixel according to a first embodiment.

FIG. 17 is a timing chart illustrating a second readout mode according to the second embodiment.

FIG. 18 is a block diagram illustrating an overall configuration of a signal processing portion according to the second embodiment.

DESCRIPTION OF THE EMBODIMENTS

Exemplary embodiments of the present invention will be described in detail in accordance with the accompanying drawings.

Configuration of Image Capturing Apparatus

Figure 1:
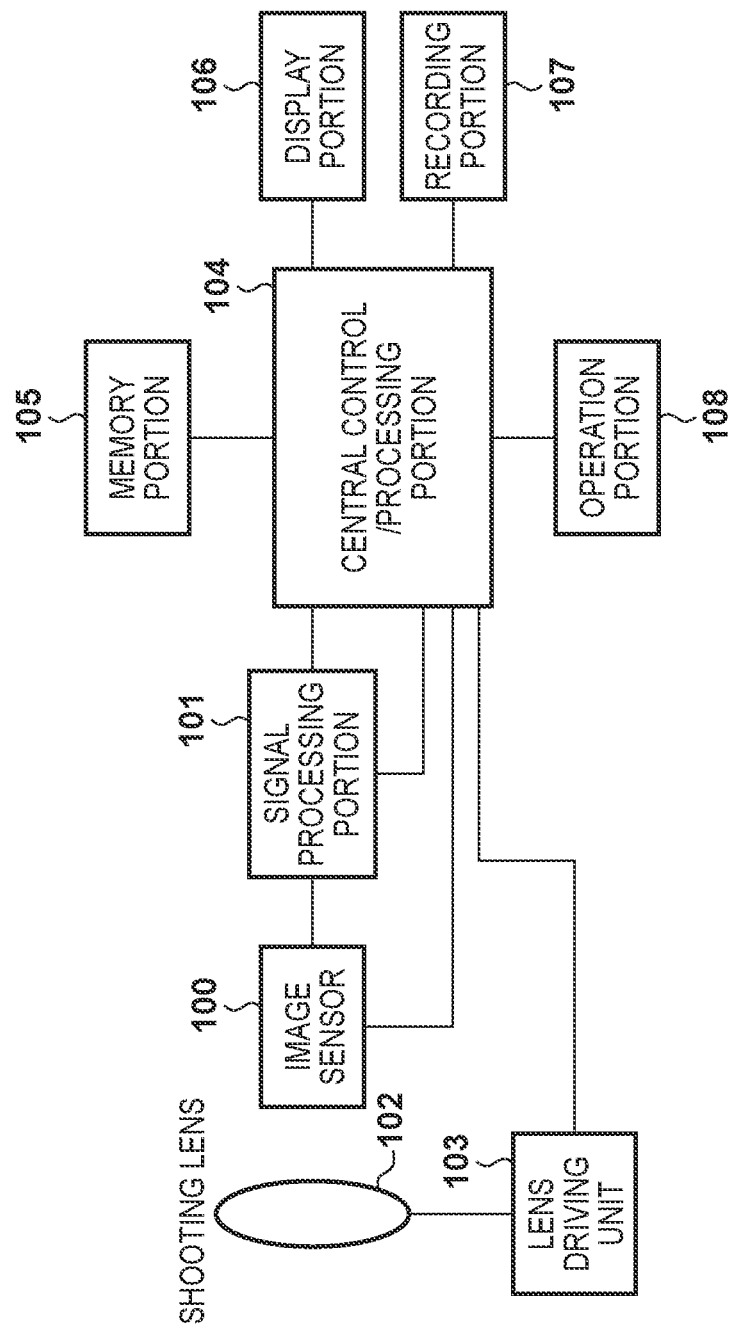
FIG. 1 is a block diagram illustrating an overall configuration of an image capturing apparatus according to embodiments of the present invention.

First, a configuration of an image capturing apparatus according to embodiments will be described. FIG. 1 is a block diagram illustrating the overall configuration of the image capturing apparatus according to embodiments of the present invention, which will be described hereinafter. As illustrated in FIG. 1, a shooting lens 102 is driven by a lens driving unit 103, and forms an optical image of a subject on an image sensor 100 after undergoing zoom control, focus control, aperture control, and the like. The image sensor 100 is constituted by a plurality of pixels, and converts the optical image of the subject, which has been formed by the shooting lens 102, into an image signal.

A signal processing portion 101 carries out signal processing, such as rearranging, on the image signal output from the image sensor 100. A central control/processing portion 104 carries out various types of calculations and control of the image capturing apparatus as a whole.

A memory portion 105 is used to temporarily store image data, and a display portion 106 displays various types of information, shot images, and the like. A recording portion 107 is a removable semiconductor memory or the like, for recording or reading out image data. An operation portion 108 is constituted by buttons, dials, and the like, and accepts the input of operations from a user. Note that if the display portion 106 is a touch panel, the touch panel is also included in the operation portion 108.

FIG. 2 is a diagram schematically illustrating the configuration of the image sensor 100. The image sensor 100 is constituted by a light-receiving region substrate 200 and a digital circuit board 210, and for example, the light-receiving region substrate 200 is layered upon the digital circuit board 210.

The light-receiving region substrate 200 includes a light-receiving region 201, a pixel control portion 203, and a reference signal generating portion 204. Light-receiving portions 202, each of which includes a photodiode that receives incident light and converts that light into a signal charge, are arranged in the light-receiving region 201 in a matrix. Although FIG. 2 illustrates 6×4 light-receiving portions 202, many more light-receiving portions 202 are actually provided. In the present embodiment, a light-receiving portion 202 and a corresponding AD conversion portion 205 are defined as an integrated pixel.

The pixel control portion 203 sends control signals to each of the light-receiving portions 202 in the light-receiving region 201. The reference signal generating portion 204 generates a reference signal for comparison with an electrical signal, output from the light-receiving portion 202 during AD conversion and corresponding to a charge (called a "pixel signal" hereinafter), and supplies the reference signal to the AD conversion portion 205. The charge generated by the light-receiving portion 202 is input to the AD conversion portion 205 as an analog pixel signal.

The digital circuit board 210 includes the AD conversion portions 205, data transfer portions 209, a digital circuit control portion 206, a signal processing portion 207, and an output portion 208. As described above, the AD conversion portions 205 are provided so as to correspond to respective ones of the light-receiving portions 202. Each AD conversion portion 205 converts the analog pixel signal supplied from the corresponding light-receiving portion 202 into a digital signal and holds that digital signal.

The data transfer portions 209 transfer the digital pixel signals held in the AD conversion portions 205 to the signal processing portion 207. The signal processing portion 207 carries out a variety of processes on the pixel signals, such as Correlated Double Sampling (CDS), offset/gain correction, and the like. The output portion 208 outputs the pixel signal processed by the signal processing portion 207 to the exterior of the image sensor 100. The digital circuit control portion 206 sends control signals for controlling the various elements, such as the AD conversion portions 205, the data transfer portions 209, the signal processing portion 207, and the output portion 208.

First Embodiment

Figure 3B:
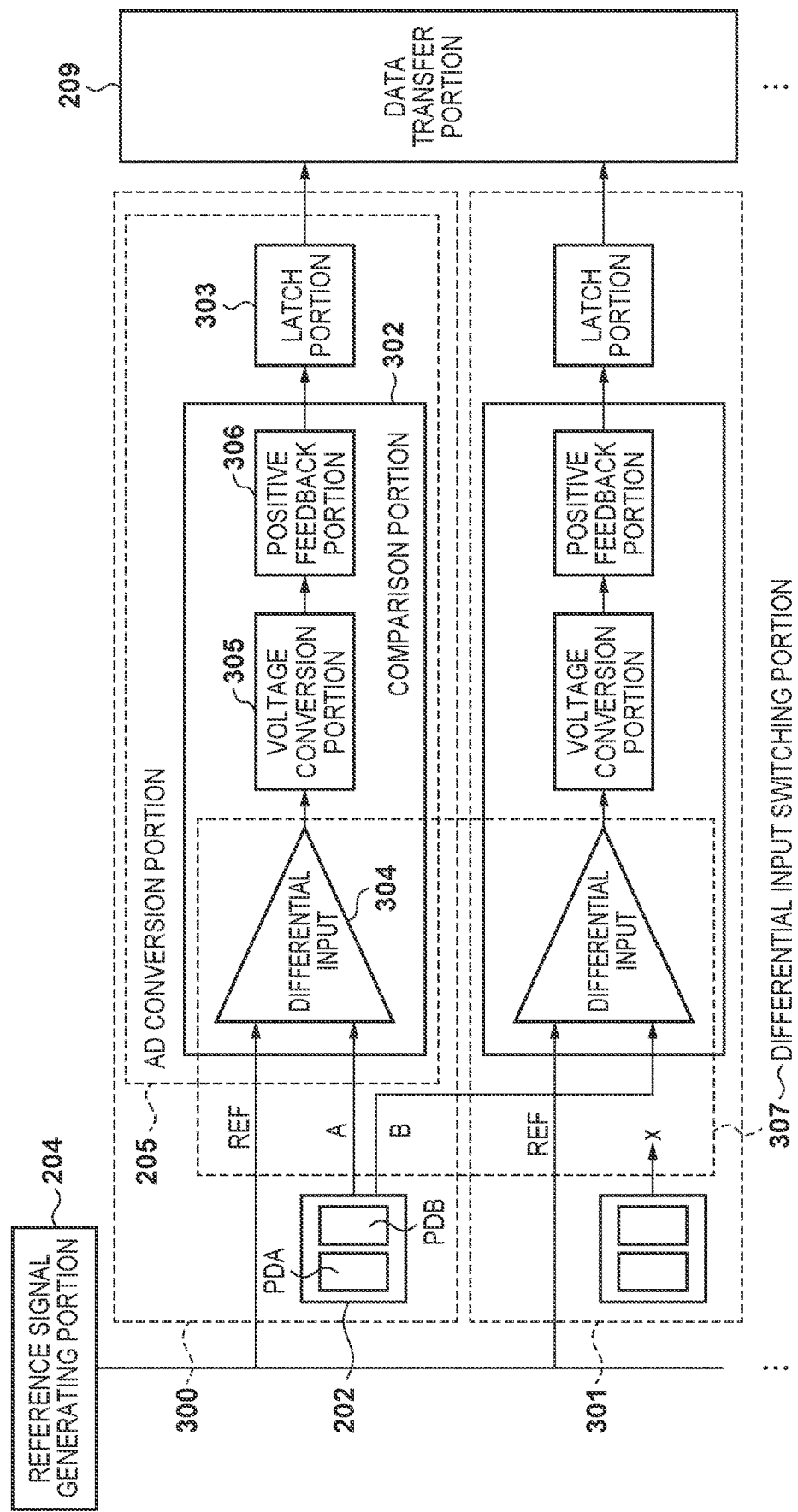
Figure 3C:
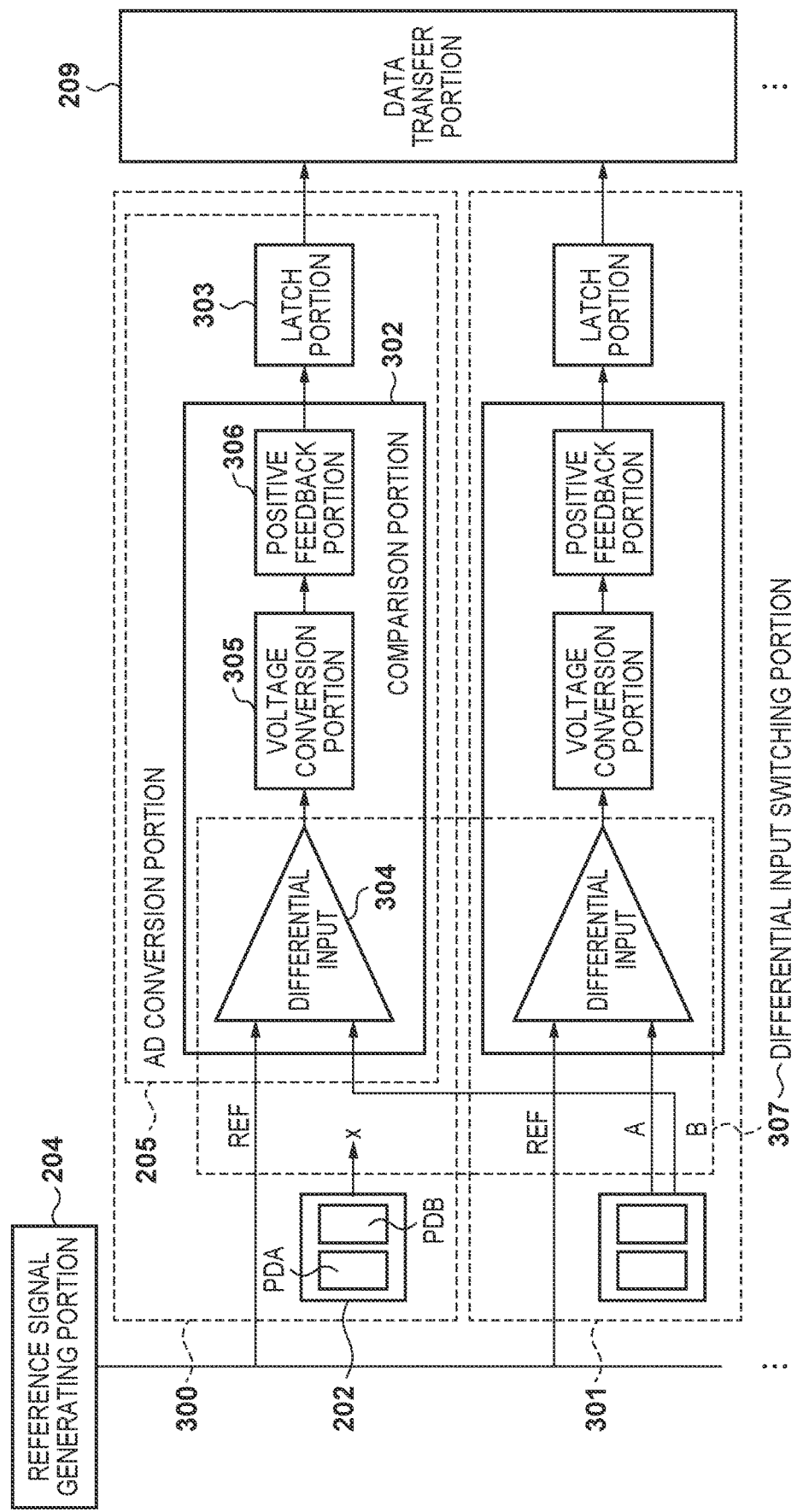

A first embodiment of the present invention will be described next. FIGS. 3A to 3C are schematic diagrams illustrating the configuration of the integrated pixel in the image sensor 100 according to the present first embodiment, and illustrate the configurations of two arbitrary integrated pixels 300 and 301 out of the many integrated pixels illustrated in FIG. 2.

In the present first embodiment, each light-receiving portion 202 includes two photodiodes (PDs). Hereinafter, one of the two photodiodes (PDs) in the light-receiving portion 202 will be called a "PDA", and the other, a "PDB". The PDA and the PDB are configured to receive light passing through different pupil regions of the shooting lens 102 via a common microlens (not shown).

By comparing signals output from the PDA and the PDB, the state of focus of the shooting lens 102 can be detected. Furthermore, adding the output signals from the PDA and the PDB makes it possible to obtain the image signal of a shot image. The light-receiving portion 202 can output the pixel signal from the PDA (called an "A signal" hereinafter), the pixel signal from the PDB (called a "B signal" hereinafter), and a pixel signal obtained by adding the A signal and the B signal (called an "A+B signal" hereinafter).

In the present first embodiment, there is a first readout mode, in which the A+B signal is output from each integrated pixel, and a second readout mode, in which the A signal and the B signal are output separately from each integrated pixel. The first readout mode can be used when shooting still images, for example. The second readout mode is used during focus detection, for example, and in this mode, the A signal and the B signal are read out only from some of the pixels, which are used for focus detection. Note that the first readout mode and the second readout mode are switched between in response to control signals supplied to the image sensor 100 from the central control/processing portion 104.

The AD conversion portion 205 includes a comparison portion 302 and a latch portion 303. The comparison portion 302 compares a reference signal REF supplied from the reference signal generating portion 204 with the pixel signal supplied from the light-receiving portion 202, and outputs a comparison result signal, which expresses the result of the comparison, to the latch portion 303. The comparison portion 302 is constituted by a differential input portion 304, a voltage conversion portion 305, and a positive feedback portion 306. These will be described in detail later with reference to FIGS. 4 and 5.

A digital count value, which counts up during a sweeping period of the reference signal REF, is input to the latch portion 303 from a count value generating portion (not shown). The count-up is started at the same time as the comparison portion 302 begins the comparison, and the count value at the point in time when the comparison result signal from the comparison portion 302 is received is held as a digital pixel signal. The digital pixel signal held in the latch portion 303 is transferred to the signal processing portion 207 via the data transfer portions 209.

A differential input switching portion 307 switches the pixel signal to be compared with the reference signal by the differential input portion 304 to the pixel signal from a different pixel, and as will be described later with reference to FIG. 4, constitutes part of the differential input portion 304. In the present embodiment, a single differential input switching portion 307 is provided for every two pixels, and the pixel signal to be compared with the reference signal REF in the differential input portion 304 is switched between these two pixels.

FIGS. 3A to 3C illustrate examples of the pixel signal input to the differential input portion 304 being switched by the differential input switching portion 307. FIG. 3A illustrates a state in which the A+B signal is output from each light-receiving portion 202 in the integrated pixels 300 and 301, and is input to the differential input portion 304 in each of the integrated pixels.

FIG. 3B illustrates a state in which the A signal output from the PDA in the integrated pixel 300 is input to the differential input portion 304 provided in the same integrated pixel 300, and the B signal output from the PDB in the integrated pixel 300 is input to the differential input portion 304 of the integrated pixel 301. In this case, a pixel signal is not output from the light-receiving portion 202 of the integrated pixel 301.

FIG. 3C illustrates a state in which the A signal output from the PDA in the integrated pixel 301 is input to the differential input portion 304 provided in the same integrated pixel 301, and the B signal output from the PDB in the integrated pixel 300 is input to the differential input portion 304 of the integrated pixel 300. In this case, a pixel signal is not output from the light-receiving portion 202 of the integrated pixel 300.

The switching operations by the differential input switching portion 307 illustrated in FIGS. 3A to 3C will be described in detail next with reference to FIG. 4. FIG. 4 is a circuit diagram illustrating the configuration of the integrated pixel.

Figure 4:
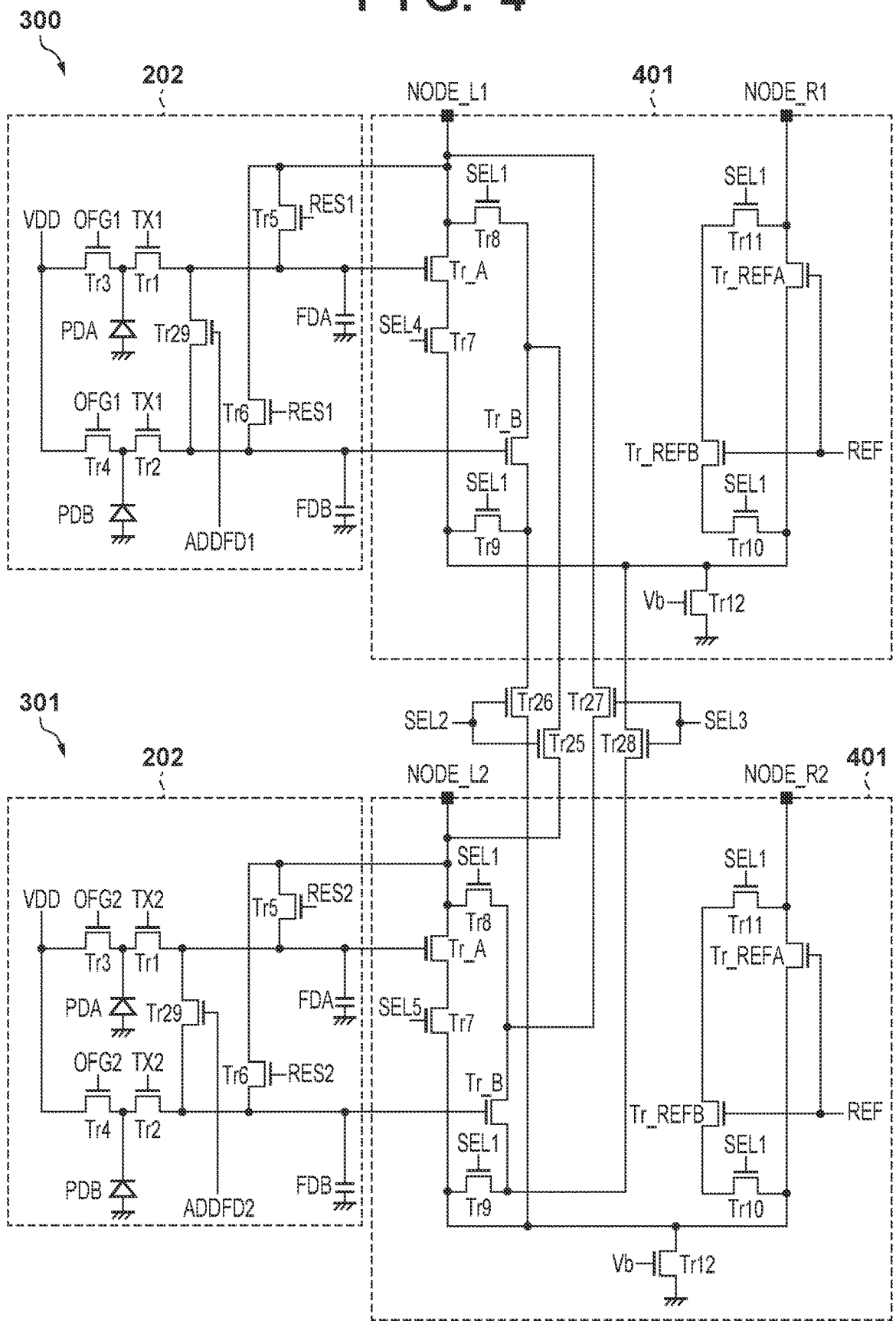
FIG. 4 is a circuit diagram illustrating a configuration of an integrated pixel according to the first embodiment.

FIG. 4 is a circuit diagram illustrating the configuration of the light-receiving portions 202 for the two integrated pixels 300 and 301, and of a differential circuit pair 401, which is part of the differential input portion 304. The configurations of the light-receiving portions 202 and the differential circuit pair 401 will be described first. However, because the integrated pixels 300 and 301 have the same configuration, only the integrated pixel 300 will be described here.

The light-receiving portion 202 includes the PDA and the PDB, transfer transistors Tr1 and Tr2, discharge transistors Tr3 and Tr4, reset transistors Tr5 and Tr6, a mixing transistor Tr29, and two floating diffusion portions (FDs). The two floating diffusion portions (FDs) in each light-receiving portion 202 will be called an "FDA" and an "FDB" hereinafter. Note that in the present embodiment, the transistors are assumed to be NMOS transistors unless specified otherwise.

A signal charge generated by the PDA in response to incident light is transferred to the FDA via the transfer transistor Tr1, into the gate of which a transfer pulse TX1 has been input. The FDA functions as a charge-voltage conversion portion that converts the signal charge transferred from the PDA into a voltage signal. Likewise, a signal charge generated by the PDB is transferred to the FDB via the transfer transistor Tr2, into the gate of which the transfer pulse TX1 has been input.

The drains of the discharge transistors Tr3 and Tr4 are connected to a power source VDD, are controlled on and off by a discharge pulse OFG1 input to the gates, and discharge the signal charges generated by the PDA and PDB, respectively. The mixing transistor Tr29 is controlled on and off by a mixing pulse ADDFD1 input to the gate, and mixes the signal charge transferred from the PDA with the signal charge transferred from the PDB by connecting the FDA and the FDB.

A reset pulse RES1 is input to the gates of the reset transistors Tr5 and Tr6, with the drains thereof being connected to a NODE_L1, and the FDA and FDB being reset to a predetermined potential.

Additionally, the FDA is connected to the gate of a pixel signal transistor Tr_A of the differential circuit pair 401, and the FDB is connected to the gate of a pixel signal transistor Tr_B.

A transistor Tr7 of the differential circuit pair 401 is a switch for connecting the source of the pixel signal transistor Tr_A to a current source transistor Tr12, and is controlled by a signal SEL4 input to the gate. The current source transistor Tr12 supplies a current based on a bias voltage Vb input to the gate.

Transistors Tr8 and Tr9 are switches for connecting the drain of the pixel signal transistor Tr_B to the NODE_L1 and the source of the pixel signal transistor Tr_B to the current source transistor Tr12, and are controlled by a signal SEL1 input to the gates. By turning the transistors Tr7, Tr8, and Tr9 on to connect the drains and sources of the pixel signal transistors Tr_A and Tr_B to each other, turning the mixing transistor Tr29 on to connect the FDA and the FDB, and setting the voltages input to the gates of the pixel signal transistors Tr_A and Tr_B to be the same, the pixel signal transistors Tr_A and Tr_B are connected in parallel.

The reference signal REF generated by the reference signal generating portion 204 is input to the gates of reference signal transistors Tr_REFA and Tr_REFB. Transistors Tr10 and Tr1*l* are switches for connecting the drains and sources of the reference signal transistors Tr_REFA and Tr_REFB to each other. The transistors Tr10 and Tr1*l* are controlled by the signal SEL1 input to the gates, and by turning the transistors Tr10 and Tr1*l* on, the reference signal transistors Tr_REFA and Tr_REFB are connected in parallel.

Here, the pixel signal transistors Tr_A and Tr_B connected in parallel, and the reference signal transistors Tr_REFA and Tr_REFB also connected in parallel, form a differential pair. The comparison portion 302 is constituted by the pixel signal transistors and reference signal transistors that form the differential pair, the current source transistor Tr12, and transistors Tr51 and Tr52, which constitute a current mirror connected to the NODE_L1 and a NODE_R1 (described later with reference to FIG. 5).

Note that the transfer transistors Tr1 and Tr2 of the integrated pixel 301 are controlled by a transfer pulse TX2 input to the gates, and the discharge transistors Tr3 and Tr4 are controlled by a discharge pulse OFG2 input to the gates. The reset transistors Tr5 and Tr6 of the integrated pixel 301 are controlled by a reset pulse RES2 input to the gates. Furthermore, the mixing transistor Tr29 is controlled by a mixing pulse ADDFD2 input to its gate.

In the integrated pixel 301, the transistor Tr7, which is a switch for connecting the source of the pixel signal transistor Tr_A to a current source transistor Tr12, is controlled by a signal SEL5 input to its gate.

Transistors Tr25 and Tr26, which are provided between the integrated pixels 300 and 301, are switches which connect the drain of the pixel signal transistor Tr_B in the integrated pixel 300 to a NODE_L2 of the integrated pixel 301, and the source to the current source transistor Tr12 of the integrated pixel 301, respectively. The transistors Tr25 and Tr26 are controlled on and off by a signal SEL2 input to their gates.

Transistors Tr27 and Tr28 are switches which connect the drain of the pixel signal transistor Tr_B in the integrated pixel 301 to the NODE_L1 of the integrated pixel 300, and the source to the current source transistor Tr12 of the integrated pixel 300, respectively. The transistors Tr27 and Tr28 are controlled on and off by a signal SEL3 input to their gates.

Here, consider a case where the signals SEL1, SEL4, and SEL5 go to H so that the transistors Tr7 to Tr1*l* of the integrated pixels 300 and 301 turn on, and the signals SEL2 and SEL3 go to L so that the transistors Tr25 to Tr28 turn off. In this case, in each of the integrated pixels 300 and 301, the pixel signal transistors Tr_A and Tr_B connected in parallel, and the reference signal transistors Tr_REFA and Tr_REFB also connected in parallel, form a differential pair.

At this time, the comparison portion 302 is constituted by the current source transistor Tr12, and the transistors Tr51 and Tr52 constituting the current mirror connected to the NODE_L1 and NODE_R1 (described later with reference to FIG. 5). Furthermore, setting the mixing pulse ADDFD1 of the integrated pixel 300 to H to turn the mixing transistor Tr29 on and mix the A signal and the B signal from the PDA and the PDB, which have been transferred to the FDA and the FDB, makes it possible to carry out operations for comparing the A+B signal with the REF signal. This connection structure corresponds to the configuration illustrated in FIG. 3A.

Now, consider a case where the signals SEL2 and SEL4 are at H and the signals SEL1, SEL3, and SEL5 are at L. In this case, the transistor Tr7 and the transistors Tr25 and Tr26 of the integrated pixel 300 are on, and the transistor Tr7 of the integrated pixel 301, as well as the transistors Tr8 to Tr1*l* and the transistors Tr27 and Tr28 of the integrated pixels 300 and 301, are off. Accordingly, the pixel signal transistor Tr_A and the reference signal transistor Tr_REFA of the integrated pixel 300 form a differential pair, and the pixel signal transistor Tr_B of the integrated pixel 300 and the reference signal transistor Tr_REFA of the integrated pixel 301 form a differential pair. This connection structure corresponds to the configuration illustrated in FIG. 3B.

Now, consider a case where the signals SEL3 and SEL5 are at H and the signals SEL1, SEL2, and SEL4 are at L. In this case, the transistor Tr7 and the transistors Tr27 and Tr28 of the integrated pixel 301 are on, and the transistor Tr7 of the integrated pixel 300, as well as the transistors Tr8 to Tr1*l* and the transistors Tr25 and Tr26 of the integrated pixels 300 and 301, are off. Accordingly, the pixel signal transistor Tr_B of the integrated pixel 301 and the reference signal transistor Tr_REFA of the integrated pixel 300 form a differential pair, and the pixel signal transistor Tr_A and the reference signal transistor Tr_REFA of the integrated pixel 301 form a differential pair. This connection structure corresponds to the configuration illustrated in FIG. 3C.

The transistors Tr7 to Tr1*l* and Tr25 to Tr28 controlled by the signals SEL1 to SEL5 in this manner function as the differential input switching portion 307, which switches the differential pairs as illustrated in FIGS. 3A to 3C.

Note that the reference signal transistors Tr_REFA and Tr_REFB are constituted by two transistors. As a result, when the differential pair has been switched by the differential input switching portion 307, the number of transistors constituting the pixel signal transistors and the reference signal transistors is the same. This makes it possible to eliminate unbalance between the driving capabilities of the two. Meanwhile, it is preferable that the MOS size be the same for the pixel signal transistors Tr_A and Tr_B and the reference signal transistors Tr_REFA and Tr_REFB.

Figure 5:
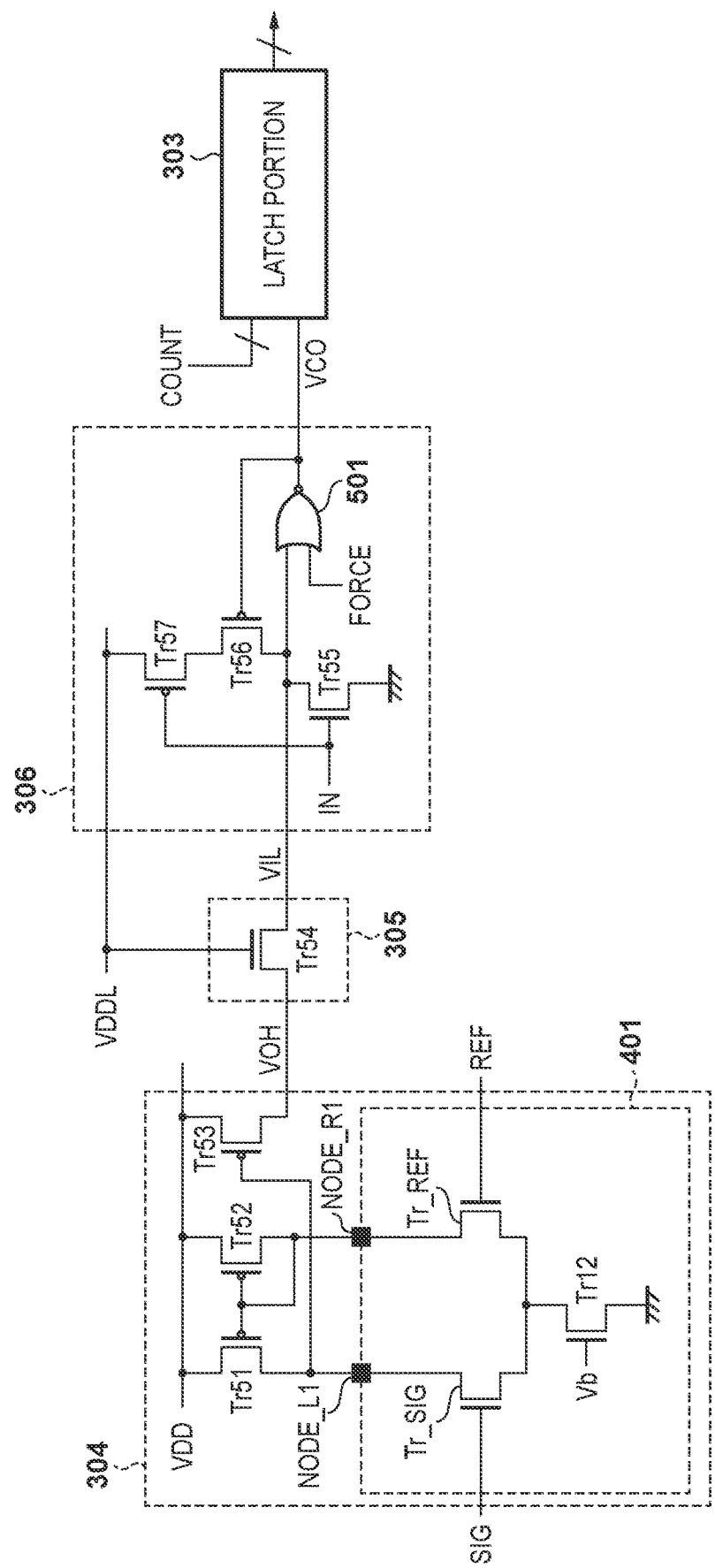
FIG. 5 is a circuit diagram illustrating a configuration of a comparison portion according to the first embodiment.

FIG. 5 is a circuit diagram illustrating, in detail, the configurations of the differential input portion 304, the voltage conversion portion 305, and the positive feedback portion 306 constituting the comparison portion 302 of the integrated pixel 301.

Note that the differential circuit pair of the differential input portion 304 is the same as in FIG. 4. Note, the pixel signal transistors and reference signal transistors constituting the differential pair are illustrated in a simplified manner, as Tr_SIG and Tr_REF, respectively.

For example, in the configuration illustrated in FIG. 3A, the pixel signal transistors Tr_A and Tr_B being connected in parallel corresponds to Tr_SIG, and the reference signal transistors Tr_REFA and Tr_REFB being connected in parallel corresponds to Tr_REF. Furthermore, although the pixel signal input to the gate of Tr_SIG is indicated by "SIG", this is either the A+B signal, the A signal, or the B signal, depending on the connection structure, illustrated in FIGS. 3A to 3C.

The differential input portion 304 compares the pixel signal SIG supplied from the light-receiving portion 202 with the reference signal REF supplied from the reference signal generating portion 204, and outputs an output signal VOH when the reference signal REF drops below the pixel signal SIG.

The differential input portion 304 is constituted by the pixel signal transistor Tr_SIG and the reference signal transistor Tr_REF constituting the differential pair, the current source transistor Tr12, the transistors Tr51 and Tr52 constituting the current mirror, and a transistor Tr53 that outputs the output signal VOH of the differential input portion 304. The transistors Tr51 and Tr52 and the transistor Tr53 are PMOS transistors.

The drain of the transistor Tr51, which constitutes the current mirror, and the gate of the transistor Tr53 are connected to the NODE_L1, which is the drain of the pixel signal transistor Tr_SIG. The drain of the transistor Tr52, and the gates of the transistors Tr51 and Tr52, are connected to the NODE_R1, which is the drain of the reference signal transistor Tr_REF. The sources of the transistors Tr51 and Tr52 and the transistor Tr53 are connected to a source voltage VDD.

When the voltage of the reference signal REF is higher than the pixel signal SIG, almost all of the current output by the current source transistor Tr12 flows in the transistor Tr52 via the reference signal transistor Tr_REF. The channel resistance of the transistor Tr51, which has a common gate with the transistor Tr52, drops sufficiently, resulting in the gate of the transistor Tr53 being essentially at source voltage VDD and the transistor Tr53 turning off.

On the other hand, when the voltage of the reference signal REF drops below the pixel signal SIG, the current output from the current source transistor Tr12 ceases flowing in the reference signal transistor Tr_REF. As a result, the gate potential of the transistors Tr51 and Tr52 rises, and the channel resistance of the transistor Tr51 increases. Then, the current flowing in via the pixel signal transistor Tr_SIG instigates a voltage drop, reducing the gate potential of the transistor Tr53 and turning the transistor Tr53 on, and the signal VOH is output.

The voltage conversion portion 305 is constituted by a transistor Tr54. The signal VOH from the differential input portion 304 is input to the drain of the transistor Tr54, with the source being an input signal VIL to the positive feedback portion 306. A power source VDDL, which has a lower voltage than the source voltage VDD, is connected to the gate of the transistor Tr54. The voltage conversion portion 305 converts the signal VOH, which has been output from the differential input portion 304 operating under the source voltage VDD, into the signal VIL, which has a voltage that can be taken by the positive feedback portion 306 operating under the voltage L that is lower than the source voltage VDD.

The positive feedback portion 306 outputs a comparison result signal VCO, which inverts when the reference signal REF drops below the pixel signal SIG, on the basis of the signal VIL obtained by the output signal VOH from the differential input portion 304 being converted by the voltage conversion portion 305. The positive feedback portion 306 increases the speed when the comparison result signal VCO inverts.

The positive feedback portion 306 is constituted by transistors Tr55, Tr56, and Tr57 and a NOR circuit 501. Note that the transistors Tr56 and Tr57 are PMOS transistors.

An initialization signal INI, which is input to the gates of the transistors Tr55 and Tr57, is a signal for initializing the comparison portion 302. When the initialization signal INI goes to H level while a forced inversion signal FORCE, which is input to the NOR circuit 501, is L, the transistor Tr55 turns on, the transistor Tr57 turns off, and the signal VIL is discharged via the transistor Tr55. As a result, the signal VIL goes to L level, and the comparison result signal VCO, which is the output from the NOR circuit 501, is initialized to H level.

During the comparison operations, L level is input for the initialization signal INI and the forced inversion signal FORCE, and the transistor Tr55 turns off, while the transistor Tr57 turns on. While the signal VIL is initialized to L level, the comparison result signal VCO, which is the output from the NOR circuit 501, is at H level, and the transistor Tr56 is off.

When the reference signal REF drops below the pixel signal SIG in the differential input portion 304, the signal VOH begins to transition to H level, and the signal VIL output from the voltage conversion portion 305 also begins to transition to H level. Then, when the comparison result signal VCO from the NOR circuit 501 begins to transition to H, the transistor Tr56 turns on, and the signal VIL is quickly charged via the transistor Tr56 and the transistor Tr57 that is already on, rising to the voltage VDDL. In this manner, the comparison result signal VCO can be transitioned to L level quickly as a result.

The forced inversion signal FORCE is a signal which, if the signal VCO has not yet transitioned to L level at the point in time when the comparison operations end, is set to H level in order to force the signal VCO to transition to L level.

A digital count value COUNT, generated by the count value generating portion (not shown), is input to the latch portion 303. Then, when the comparison result signal VCO supplied from the positive feedback portion 306 transitions from H to L, the digital count value COUNT at that point in time is held as a digital pixel signal. The digital pixel signal held in the latch portion 303 is transferred to the signal processing portion 207 via the data transfer portion 209.

Note that the NODE_L1 and the NODE_R1 of the integrated pixel 300 being the NODE_L2 and NODE_R2 instead, the integrated pixel 301 has the same configuration, and will therefore not be described here.

A method of driving the image capturing apparatus according to the first embodiment will be described next. As described above, in the present first embodiment, there is a first readout mode, in which the A+B signal obtained by adding the signals from the PDA and the PDB is output from the integrated pixel, and a second readout mode, in which the A signal and the B signal are output from the PDA and the PDB, respectively, of the integrated pixel, in every other row.

Figure 6:
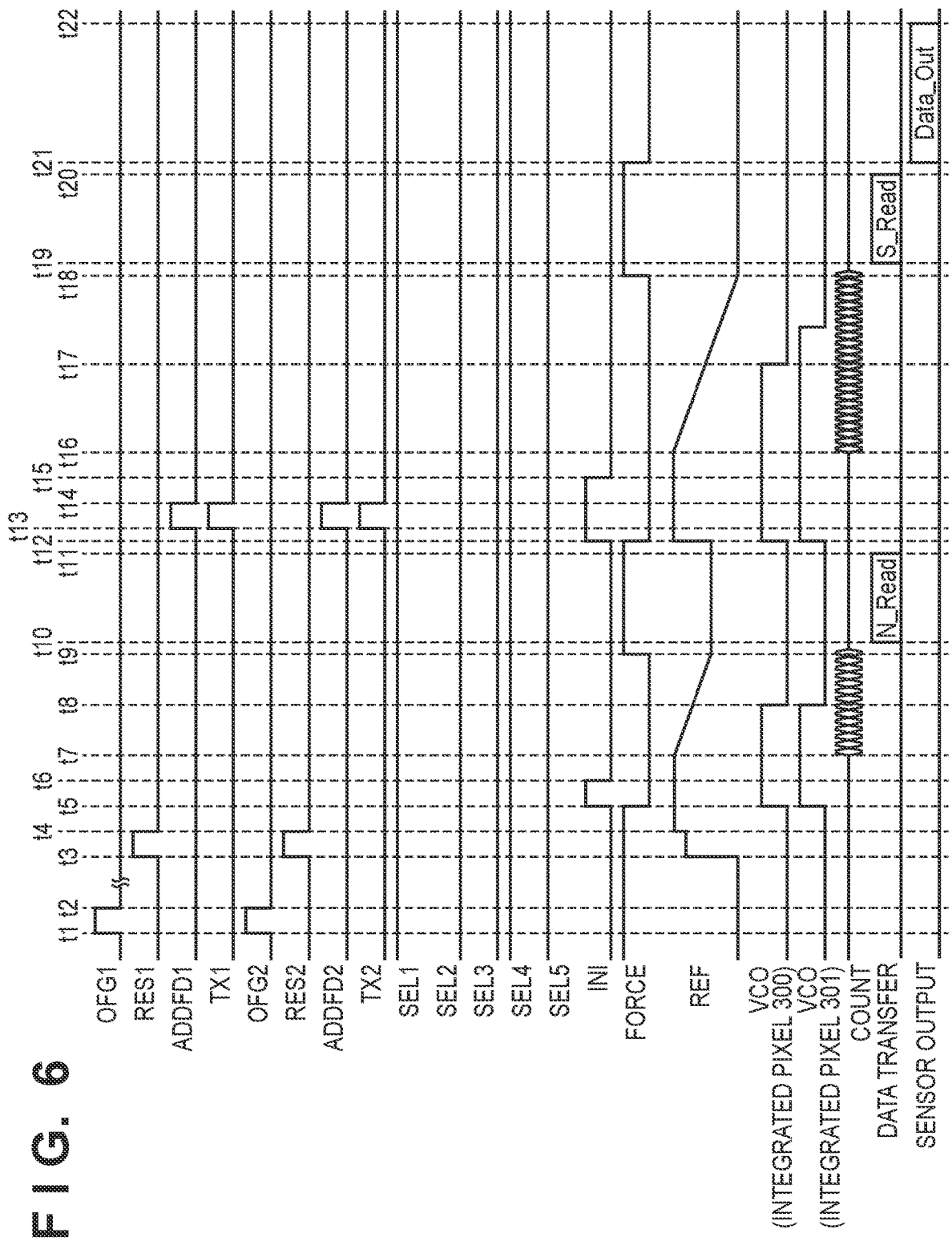
FIG. 6 is a timing chart illustrating a first readout mode according to the first embodiment.

FIG. 6 is a timing chart illustrating the first readout mode. Although FIG. 6 illustrates control signals supplied to the integrated pixel 300 and the integrated pixel 301, for the other pixels as well, the same types of control signals are supplied per two pixels sharing the differential input switching portion 307. In the first readout mode, the connection structure illustrated in FIG. 3A is achieved by setting the signals SEL1, SEL4, and SEL5 to H and the signals SEL2 and SEL3 to L.

At time t1, the discharge pulses OFG1 and OFG2 go to H, the discharge transistors Tr3 and Tr4 turn on, and the signal charges generated by the PDA and the PDB are discharged to the drains of the discharge transistors Tr3 and Tr4. At time t2, the discharge pulses OFG1 and OFG2 go to L, the discharge transistors Tr3 and Tr4 both turn off, and the accumulation of signal charges begins for all of the integrated pixels simultaneously.

Once a predetermined accumulation period has passed, at time t3, the reference signal REF is set to a predetermined voltage, and the reset pulses RES1 and RES2 supplied to the integrated pixels, go to H, in order to reset the floating diffusion portions in the pixels. The charges in the FDA and the FDB are reset as a result. Then, at time t4, the reset pulses RES1 and RES2 go to L, and the resetting of the FDA and the FDB is canceled.

At time t5, the forced inversion signal FORCE goes to L and the initialization signal INI goes to H, and the positive feedback portion 306 enters an initial state. At this time, the comparison result signal VCO, which is the output from the comparison portion 302 in each integrated pixel, goes to H.

At time t6, the initialization signal INI goes to L, and the initialization of the positive feedback portion 306 is canceled. At this point in time, the reference signal REF is set to a value higher than the pixel signal SIG, and thus the comparison result signal VCO from the comparison portion 302 remains at H.

From time t7 to t9, operations are carried out for AD-converting a reset level signal (called an "N signal" hereinafter), in a state where the floating diffusion portions are reset. The N signal is used in a CDS process for subtracting the N signal from an S signal, which is the pixel signal (described later). In the following descriptions, the period during which the N signal is AD-converted will be called an "N conversion period". At time t7, the reference signal REF begins sweeping from a predetermined voltage toward L level, and at the same time, the digital count value COUNT supplied to the latch portion 303 begins rising.

For example, when the reference signal REF drops below the pixel signal SIG at time t8, the comparison result signal VCO from that integrated pixel goes to L. The digital count value COUNT at that point in time is held in the latch portion 303 as the N signal.

When, at time t9, the sweeping of the reference signal REF ends, the forced inversion signal FORCE goes to H. If there is an integrated pixel for which N signal is not yet finalized at that point in time, the VCO of that pixel is forced to L, and the digital count value COUNT at that point in time is held in the latch portion 303.

From times t10 to t11, the N signals held in the latch portions 303 of the integrated pixels are sequentially read out to the signal processing portion 207 via the data transfer portions 209. The N signals output to the signal processing portion 207 are temporarily held in memory such as RAM provided in the signal processing portion 207.

At time t12, the reference signal REF is once again set to the predetermined voltage, the forced inversion signal FORCE goes to L, the initialization signal INI goes to H, and the positive feedback portion 306 enters the initial state. At this time, the comparison result signal VCO from the comparison portion 302 in each integrated pixel goes to H.

From times t13 to 14, the transfer pulses TX1 and TX2 in each integrated pixel go from L to H to L, and the signal charges accumulated in the PDA and the PDB of each integrated pixel are transferred to the FDA and the FDB. At this time, the mixing pulses ADDFD1 and ADDFD2 also go from L to H to L at the same time, and the mixing transistor Tr29 turns off, then on, and then off, which causes the signal charges in the FDA and the FDB to be mixed. As a result, a voltage based on a signal charge that is the average of the signal charges accumulated in the PDA and the PDB is supplied to the gate of the pixel signal transistors Tr_A and Tr_B. Accordingly, the comparison portion 302 in each integrated pixel can compare the A+B signal with the REF signal.

Then, at time t15, the initialization signal INI goes to L, and the initialization of the positive feedback portion 306 is canceled.

From times t16 to t18, AD conversion operations are carried out for converting the signal charges accumulated in the PDA and the PDB of each integrated pixel into a pixel signal (called the "S signal" hereinafter) transferred to the FDA and the FDB. Here, the S signal corresponds to the A+B signal. In the following descriptions, the period during which the S signal is AD-converted will be called an "S conversion period". At time t16, the reference signal REF begins sweeping from a predetermined voltage toward L level, and at the same time, the digital count value COUNT supplied to the latch portion 303 begins counting up.

For example, when the reference signal REF drops below the A+B signal, which is the pixel signal of the integrated pixel 300, at time t17, the comparison result signal VCO from that integrated pixel goes to L. The digital count value COUNT at that point in time is held in the latch portion 303 as the S signal (the A+B signal).

When, at time t18, the sweeping of the reference signal REF ends, the forced inversion signal FORCE goes to H. If at this point in time there is an integrated pixel for which the S signal is not yet finalized, the comparison result signal VCO of that integrated pixel is forced to L, and the digital count value COUNT at that point in time is held in the latch portion 303.

From times t19 to t20, the S signals held in the latch portions 303 of the integrated pixels are sequentially read out to the signal processing portion 207 via the data transfer portions 209. The S signals output to the signal processing portion 207 are temporarily held in memory such as RAM provided in the signal processing portion 207.

Then, from times t21 to t22, the pixel signals, which are subjected to predetermined correction processing and the like in the signal processing portion 207, are output to the exterior of the image sensor 100 sequentially via the output portion 208. The A+B signal is output from each pixel through the operations described above.

Driving control in the second readout mode will be described next with reference to the timing chart in FIG. 7.

Figure 7:
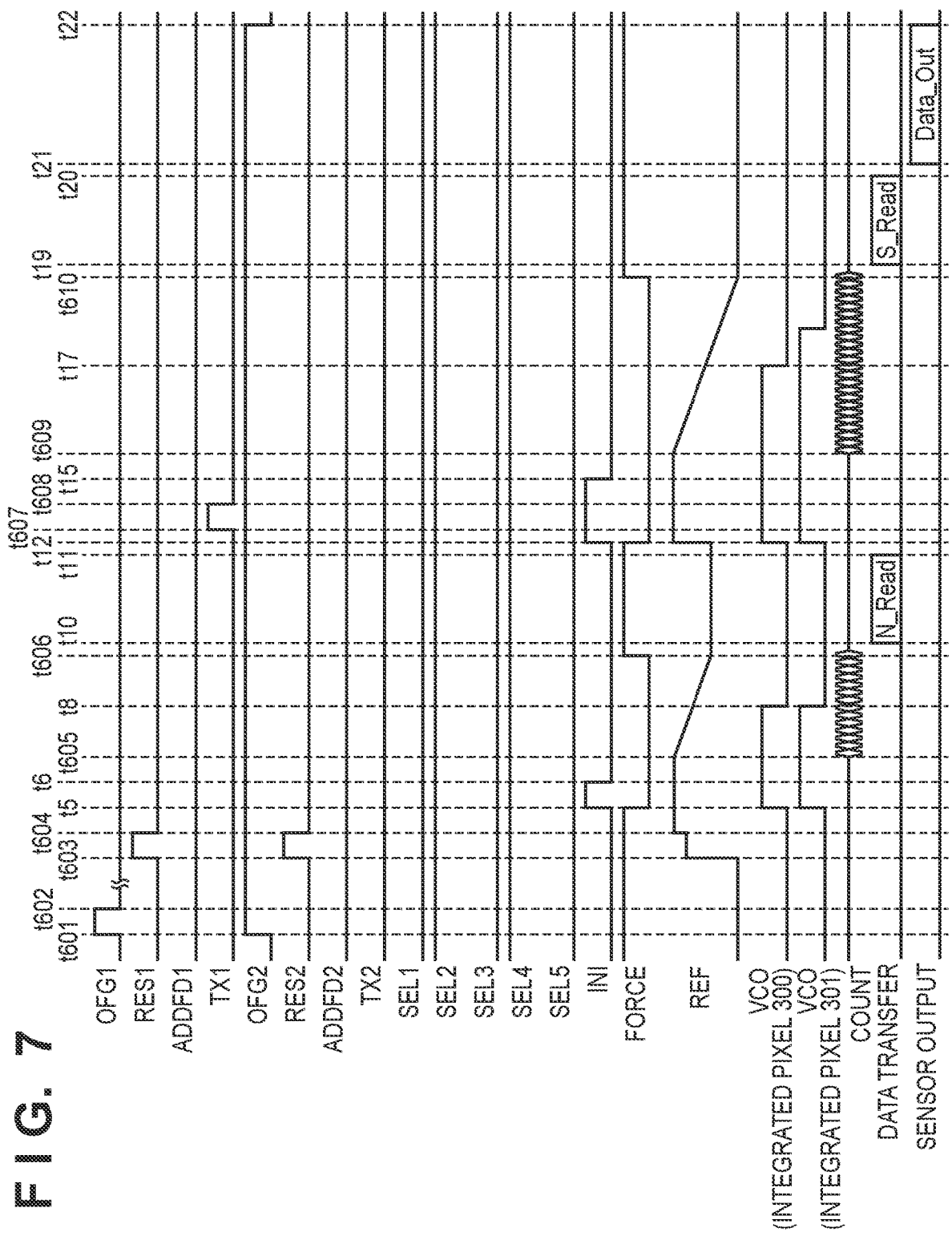
FIG. 7 is a timing chart illustrating a second readout mode according to the first embodiment.

In FIG. 7, timings at which the same operations as those in the first readout mode, illustrated in FIG. 6, are carried out will be given the same reference signs, and descriptions thereof will be omitted as appropriate.

In the second readout mode, the connection structure illustrated in FIG. 3B is achieved by setting the signals SEL2 and SEL4 to H and the signals SEL1, SEL3, and SEL5 to L. As a result, of the integrated pixels 300 and 301, the A signal and the B signal are read out from the integrated pixel 300, while no pixel signal is output from the integrated pixel 301. The A signal and the B signal read out from the integrated pixel 300 are used by the central control/processing portion 104 for focus detection.

First, at time t601, the discharge pulses OFG1 and OFG2 go to H, and the signal charges generated by the PDA and the PDB are discharged to the drains of the discharge transistors Tr3 and Tr4. Then, at time t602, the discharge pulse OFG1 goes to L while the discharge pulse OFG2 remains at H. As a result, the PDA and the PDB of the integrated pixel 300 begin accumulating signal charges, but the PDA and the PDB of the integrated pixel 301 remain in a state of signal charge discharge.

Once a predetermined accumulation period has passed, at time t603, the reference signal REF is set to a predetermined voltage, and the reset pulse RES1 goes to H, in order to reset the FDA and the FDB in the integrated pixel 300. The charges in the FDA and the FDB of the integrated pixel 300 are reset as a result. Then, at time t604, the reset pulse RES1 goes to L, and the resetting of the FDA and the FDB in the integrated pixel 300 is cancelled. Note that from time t603 to t604, the reset pulse RES2 goes from L to H to L, and the FDA and the FDB of the integrated pixel 301 are reset as well, but these operations may be omitted.

During the N conversion period, spanning from time t605 to t606, the N signal from the FDA of the integrated pixel 300 is compared with the reference signal REF by the pixel signal transistor Tr_A and the reference signal transistor Tr_REFA of the integrated pixel 300, which constitute a differential pair. The AD-converted N signal from the FDA of the integrated pixel 300 is then held in the latch portion 303 of the integrated pixel 300.

Additionally, the N signal from the FDB of the integrated pixel 300 is compared with the reference signal REF by the pixel signal transistor Tr_B of the integrated pixel 300 and the reference signal transistor Tr_REFA of the integrated pixel 301, which constitute a differential pair. The AD-converted N signal from the FDB of the integrated pixel 300 is then held in the latch portion 303 of the integrated pixel 301. From times t10 to t11, the N signals held in the latch portions 303 of the integrated pixels 300 and 301 are output to the signal processing portion 207 via the data transfer portions 209.

From times t607 to t608, the transfer pulse TX1 of the integrated pixel 300 goes from L to H to L, and in the integrated pixel 300, the signal charges accumulated in the PDA and the PDB are transferred to the FDA and the FDB, respectively. As a result, a voltage based on the signal charge that had been accumulated in the PDA is supplied to the gate of the pixel signal transistor Tr_A, and a voltage based on the signal charge that had been accumulated in the PDB is supplied to the pixel signal transistor Tr_B.

During the S conversion period, spanning from time t609 to t610, the A signal from the integrated pixel 300 is compared with the reference signal REF by the pixel signal transistor Tr_A and the reference signal transistor Tr_REFA of the integrated pixel 300, which constitute a differential pair. The AD-converted A signal is then held in the latch portion 303 of the integrated pixel 300.

Additionally, the B signal from the integrated pixel 300 is compared with the reference signal REF by the pixel signal transistor Tr_B of the integrated pixel 300 and the reference signal transistor Tr_REFA of the integrated pixel 301, which constitute a differential pair. The AD-converted B signal is then held in the latch portion 303 of the integrated pixel 301.

From times t19 to t20, the A signal and the B signal from the integrated pixel 300, held in the latch portions 303 of the integrated pixels 300 and 301, are output to the signal processing portion 207 via the data transfer portions 209.

The A signal and the B signal from the same integrated pixel can be AD-converted and output in parallel through the above operations.

The accumulation time of the A signal and the B signal spans from when the discharge transistors Tr3 and Tr4 turn off at t602 to when the transfer transistors Tr1 and Tr2 turn off at t608. Accordingly, there is no accumulation timing difference between the A signal and the B signal. A drop in the focus detection performance for moving objects can therefore be prevented.

Note that setting the signals SEL3 and SEL5 to H and the signals SEL1, SEL2, and SEL4 to L makes it possible to achieve the connection structure illustrated in FIG. 3C. The signals from the PDA and the PDB of the integrated pixel 301 can be read out simultaneously by switching the control for the integrated pixel 300, described above with reference to FIG. 7, with the integrated pixel 301.

Figure 8A:
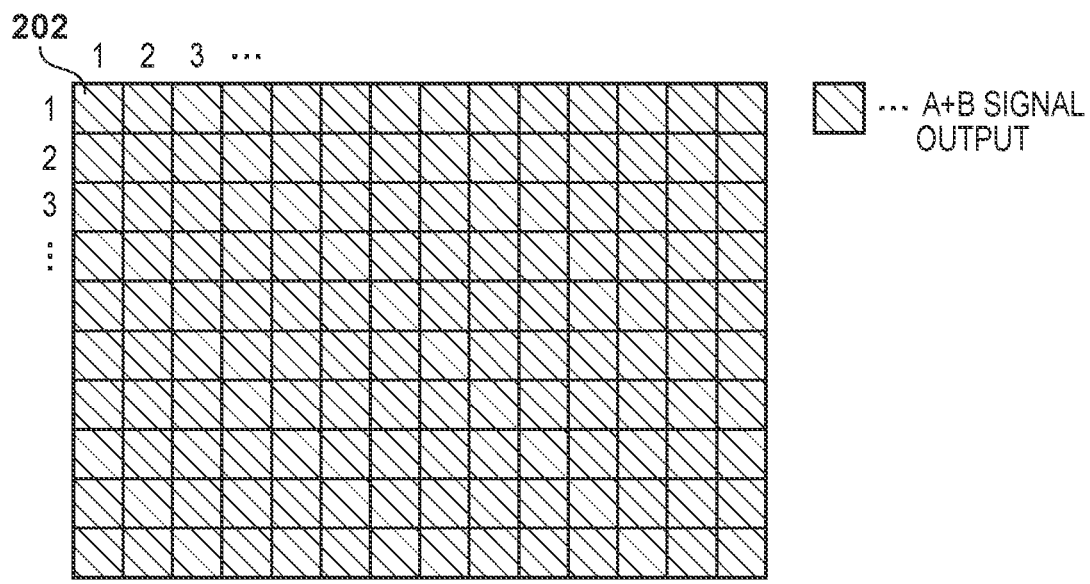
FIGS. 8A and 8B are schematic diagrams illustrating light receiving portions which output an A+B signal and AD conversion portions which is used while in the first readout mode according to the first embodiment.
Figure 8B:
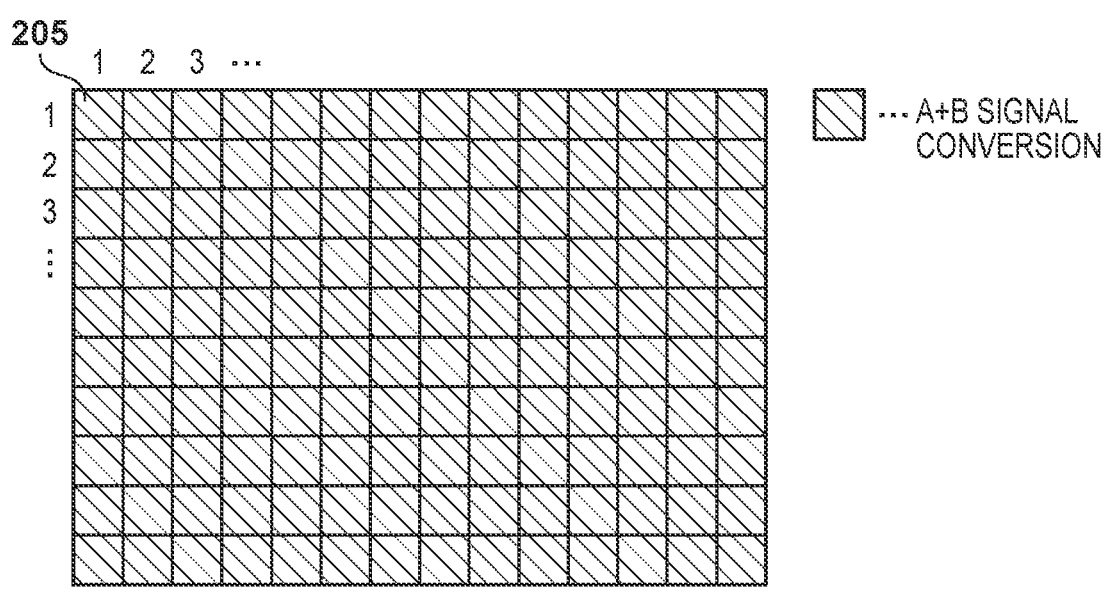

FIGS. 8A and 8B are schematic diagrams illustrating an example of the light-receiving portions 202 that output the A+B signal and the AD conversion portions 205 that are used in the first readout mode. FIGS. 8A and 8B illustrate correspondence relationships between the light-receiving portions 202 and the AD conversion portions 205. The light-receiving portions 202 and the AD conversion portions 205 at the same coordinates belong to the same integrated pixel. Additionally, two adjacent integrated pixels, as in the first and second rows or third and fourth rows of the same column, are pixels that share the differential input switching portion 307, as illustrated in FIGS. 3A to 3C.

In FIG. 8A, the light-receiving portions 202 filled with oblique lines are light-receiving portions 202 which output the A+B signal, and in FIG. 8B, the AD conversion portions 205 filled with oblique lines are AD conversion portions 205 which are used to AD-convert the A+B signals. As illustrated in FIGS. 8A and 8B, in the first readout mode, all light-receiving portions 202 and AD conversion portions 205 are used.

Figure 9A:
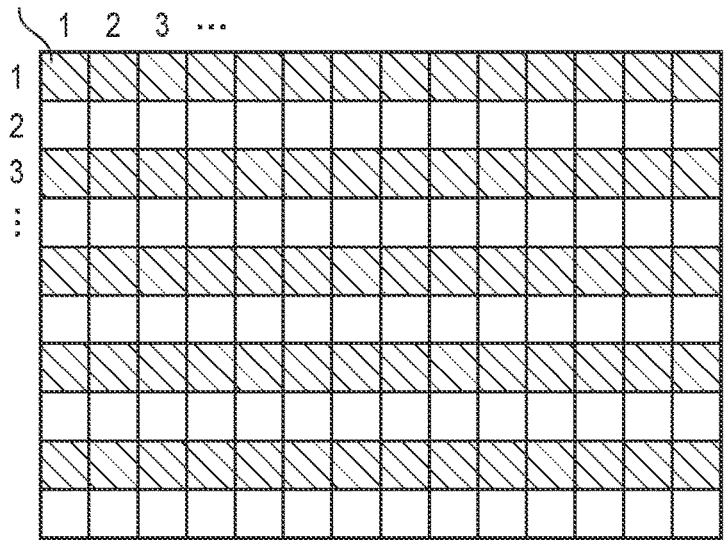
FIGS. 9A and 9B are schematic diagrams illustrating light receiving portions which output an A signal and a B signal and AD conversion portions which are used while in the second readout mode, according to the first embodiment.
Figure 9B:
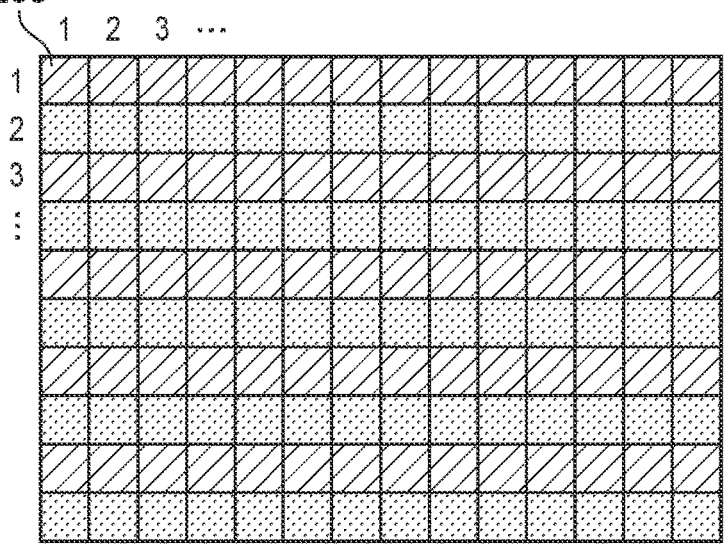

FIGS. 9A and 9B are schematic diagrams illustrating an example of the light-receiving portions 202 that output the A signal and the B signal and the AD conversion portions 205 that are used in the second readout mode. In FIG. 9A, the light-receiving portions 202 filled with oblique lines are light-receiving portions 202 which output the A signal and the B signal. In FIG. 9B, the AD conversion portions 205 filled with oblique lines are AD conversion portions 205 which are used to AD-convert the A signals, whereas the AD conversion portions 205 filled with dots are AD conversion portions 205 which are used to AD-convert the B signals.

In the second readout mode, the A signals and B signals are output from the light-receiving portions 202 in the odd-numbered rows and used for focus detection. At this time, the AD conversion portions 205 in the odd-numbered rows AD-convert the B signals, whereas the AD conversion portions 205 in the even-numbered rows AD-convert the A signals. Note that in a case where the connection structure illustrated in FIG. 3C is used, combinations of the light-receiving portions 202 and the AD conversion portions 205 are different from those shown in FIGS. 9A and 9B in that the A signals and the B signals are output from the light-receiving portions 202 in the even-numbered rows, the AD conversion portions 205 in the odd-numbered rows AD-convert the B signals, and the AD conversion portions 205 in the even-numbered rows AD-convert the A signals.

According to the above-described operations, during the second readout mode, even if a plurality of AD conversion portions are not provided for each pixel, the A signal and the B signal can be AD-converted and output in parallel. In particular, it is not necessary to provide a new latch portion, which requires a broad circuit area, and thus makes it possible to suppress a major increase in the circuit area. Furthermore, because the A signal and the B signal are AD-converted in parallel, no difference arises between the accumulation timings of the two. A drop in the focus detection performance for moving objects can therefore be prevented. Additionally, during the first readout mode, the A+B signals can be AD-converted and output in parallel for all of the pixels, which makes it possible to carry out global shutter operations.

Figure 10:
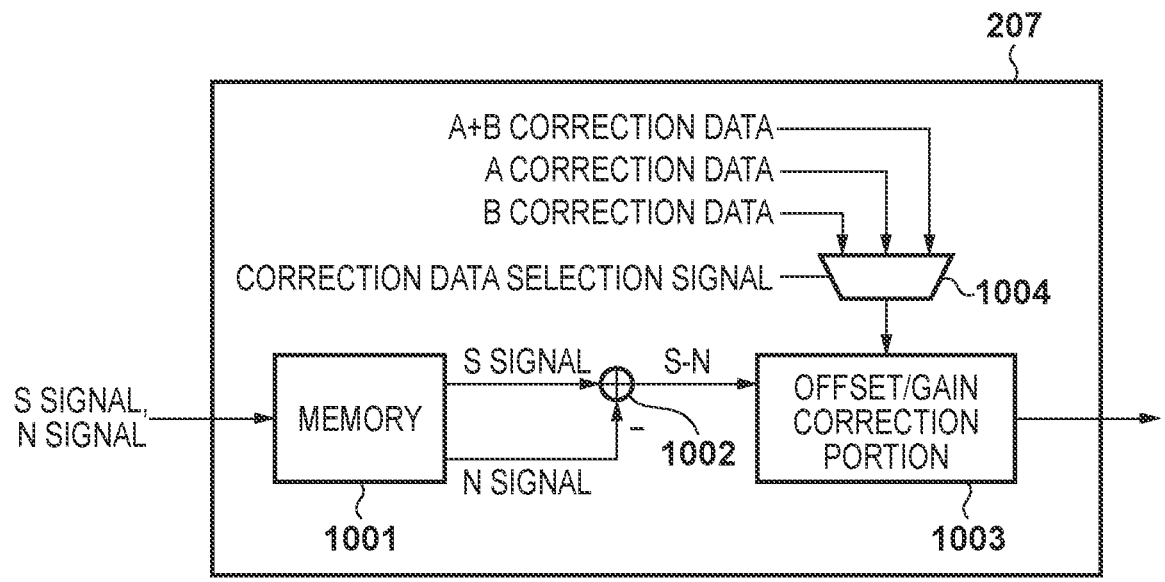
FIG. 10 is a block diagram illustrating an overall configuration of a signal processing portion according to the first embodiment.

FIG. 10 is a diagram illustrating an example of the configuration of the signal processing portion 207 according to the first embodiment. The signal processing portion 207 includes memory 1001, an S-N portion 1002, an offset/gain correction portion 1003, and a correction data selection portion 1004.

The memory 1001 is volatile memory such as Random Access Memory (RAM), and temporarily holds the S signal, which is the pixel signal output from each pixel via the data transfer portion 209, and the N signal, which is the reset level signal. Here, the S signal is either the A+B signal, the A signal, or the B signal.

The S-N portion 1002 carries out a CDS process by subtracting the corresponding N signal from the S signal of each pixel, held in the memory 1001, and inputs the processed image signal to the offset/gain correction portion 1003.

The offset/gain correction portion 1003 corrects offset shift and gain shift arising due to changes in the capacitances of the floating diffusion portions when the AD conversion portions used during the AD conversion are switched, differences between the characteristics of the AD conversion portions, and the like. In the present embodiment, the configuration during AD conversion is different for the A+B signal, the A signal, and the B signal, and thus different correction data is used for the same pixel.

The correction data selection portion 1004 selects one of A+B correction data, A correction data, and B correction data, which are held in memory or the like (not shown), in accordance with a correction data selection signal supplied from the digital circuit control portion 206, and supplies the selected correction data to the offset/gain correction portion 1003.

For example, the offset/gain correction portion 1003 carries out correction as indicated by Equation (1), using the supplied correction data.

$$\text{OUTPUT} = \alpha \times \text{INPUT} + \beta \qquad (1)$$

Here, "INPUT" is the input pixel signal, and "OUTPUT" is the corrected pixel signal. α and β are gain correction data and offset correction data, respectively, which are included in the A+B correction data, A correction data, and B correction data supplied from the correction data selection portion 1004.

Note that the correction process carried out by the signal processing portion 207 may instead be carried out by the signal processing portion 101 or the central control/processing portion 104 illustrated in FIG. 1.

As described thus far, according to the first embodiment, using the first readout mode when shooting a still image makes it possible to accumulate charges in all integrated pixels simultaneously and AD-convert the obtained pixel signals in parallel, which enables shooting through the global shutter method. On the other hand, using the second readout mode during focus detection makes it possible to AD-convert the A signal and the B signal in parallel by using the AD conversion portions of the integrated pixels from which pixel signals are not read out. The accumulation times of the A signal and the B signal can thus be matched.

The above-described configuration and control makes it possible to achieve both the first readout mode, in which a single pixel signal is output from the integrated pixel, and the second readout mode, in which a plurality of pixel signals are output from the integrated pixel, while suppressing a major increase in the circuit scale of the AD conversion portions.

Variation on First Embodiment

In the above-described first embodiment, only the integrated pixels in the odd-numbered rows output the A signal and the B signal during the second readout mode. However, shifting the timing of the AD conversion between the even-numbered rows and the odd-numbered rows makes it possible to output the A signal and the B signal from all of the integrated pixels. This driving mode will be called a "third readout mode", and will be described below. In the following descriptions, the integrated pixel may simply be called a "pixel" as appropriate.

Figure 11:
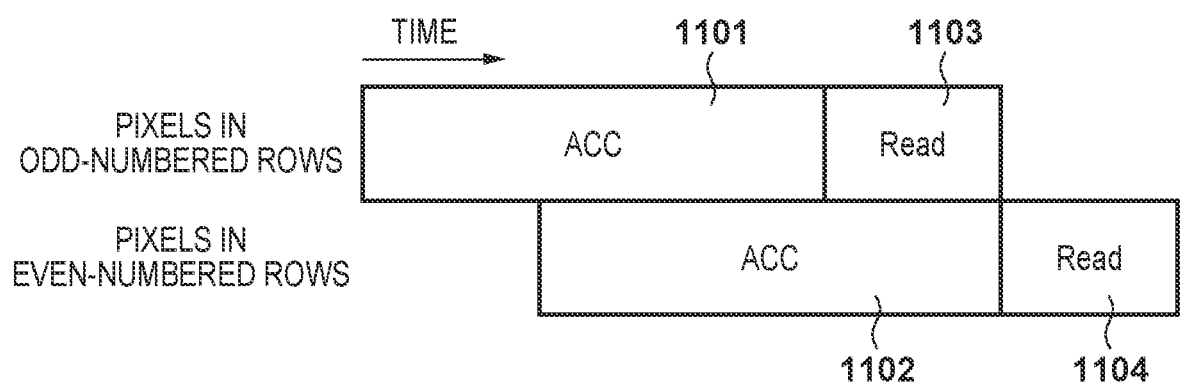
FIG. 11 is a schematic diagram illustrating timings in a third readout mode according to a variation on the first embodiment.

FIG. 11 is a schematic diagram illustrating the driving timing of the third readout mode according to the variation on the first embodiment. FIG. 11 indicates accumulation periods 1101 and 1102 and readout periods 1103 and 1104 for pixels in odd-numbered rows and pixels in even-numbered rows. As illustrated in FIG. 11, according to the variation on the first embodiment, the driving is carried out having shifted the accumulation periods and the readout periods depending on whether the pixels are in odd-numbered rows or in even-numbered rows.

Figure 12:
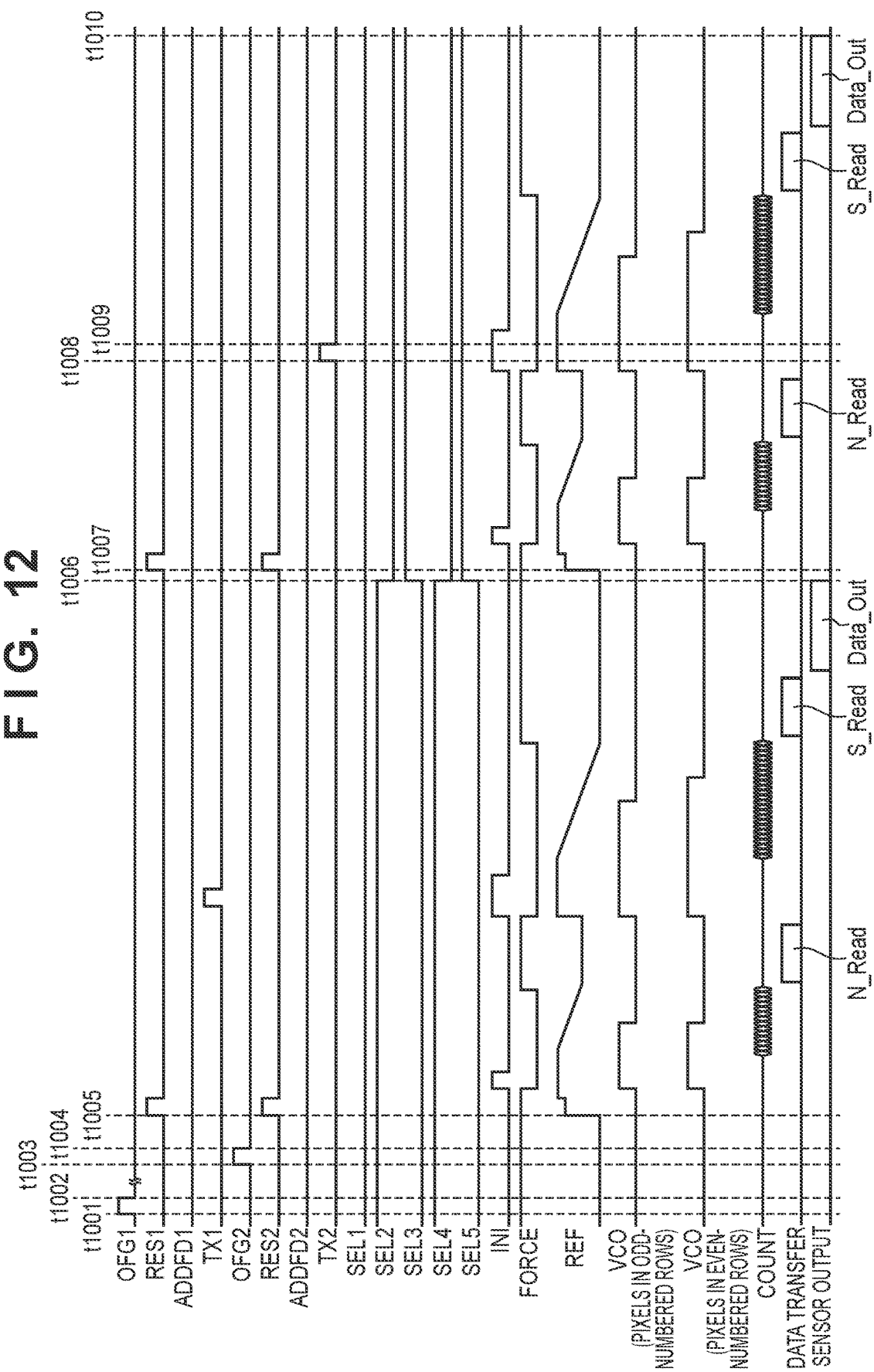
FIG. 12 is a timing chart illustrating the third readout mode according to a variation on the first embodiment.

FIG. 12 illustrates, in detail, the driving timing of the third readout mode according to the variation on the first embodiment. Note that the pixels in the odd-numbered rows and the pixels in the even-numbered rows in FIG. 12 correspond to the integrated pixels 300 and 301, respectively, illustrated in FIGS. 3A to 3C. In the timing chart in FIG. 12, areas where the same operations as in the timing chart in FIG. 7 are carried out will not be described.

In FIG. 12, times t1002 and t1004 correspond to the start times of the accumulation periods 1101 and 1102, respectively, illustrated in FIG. 11. Likewise, time t1005 to t1006 corresponds to the readout period 1103 for the odd-numbered rows, and time t1006 to t1010 corresponds to the readout period 1104 for the even-numbered rows.

In the third readout mode, first, the connection structure illustrated in FIG. 3B is achieved by setting the signals SEL2 and SEL4 to H and the signals SEL1, SEL3, and SEL5 to L.

From time t1001 to t1002, the discharge pulse OFG1 for the pixel in the odd-numbered row changes from L to H to L, the signal charges generated by the PDA and PDB in the pixel in the odd-numbered row are discharged at the drains of the discharge transistors Tr3 and Tr4, and the signal charge accumulation then starts.

From time t1003 to t1004, the discharge pulse OFG2 for the pixel in the even-numbered row changes from L to H to L, the signal charges generated by the PDA and PDB in the pixel in the even-numbered row are discharged at the drains of the discharge transistors Tr3 and Tr4, and the signal charge accumulation then starts. Although not illustrated in FIG. 12, the length of the period from time t1002 to time t1004 corresponds to the length of the time from t1005 to t1006, which is the time required to read out the signal from the pixel in the odd-numbered row.

After a predetermined accumulation period has passed, from time t1005 to t1006, the A signal and the B signal from the pixel in the odd-numbered row is AD-converted and output. These operations are the same as the operations for reading out the A signal and the B signal from the integrated pixel 300, indicated by time t603 to t22 in FIG. 7, and will therefore not be described. As a result of these operations, the A signals from the light-receiving portions 202 of the pixels in the odd-numbered rows are AD-converted by the AD conversion portions of the pixels in the odd-numbered rows, and the B signals from the light-receiving portions of the pixels in the odd-numbered rows are AD-converted by the AD conversion portions of the pixels in the even-numbered rows, as illustrated in FIGS. 9A and 9B.

After the A signal and the B signal from the pixel in the odd-numbered row has been AD-converted and output, from time t1007 to t1010, the A signal and the B signal from the pixel in the even-numbered row is AD-converted and output. At this time, the connection structure illustrated in FIG. 3C is achieved by setting the signals SEL3 and SEL5 to H and the signals SEL1, SEL2, and SEL4 to L.

From times t1008 to t1009, the transfer pulse TX2 of the pixel in the even-numbered row goes from L to H to L, and the signal charges accumulated in the PDA and the PDB of each pixel in the even-numbered row are transferred to the FDA and the FDB, respectively. As a result, in the pixel in the even-numbered row, a voltage based on the signal charge that had been accumulated in the PDA is supplied to the gate of the pixel signal transistor Tr_A, and a voltage based on the signal charge that had been accumulated in the PDB is supplied to the pixel signal transistor Tr_B.

Then, the pixel signal transistor Tr_B of the pixel in the even-numbered row and the reference signal transistor Tr_REFA of the pixel in the odd-numbered row, which form a differential pair, compare the B signal from the pixel in the even-numbered row with the reference signal REF. The AD-converted B signal is then held in the latch portion 303 of the pixel in the odd-numbered row, which corresponds to the integrated pixel 300 in FIG. 3C. On the other hand, the pixel signal transistor Tr_A and the reference signal transistor Tr_REFA of the pixel in the even-numbered row, which form a differential pair, compare the A signal from the pixel in the even-numbered row with the reference signal REF. The AD-converted A signal is then held in the latch portion 303 of the pixel in the even-numbered row, which corresponds to the integrated pixel 301 in FIG. 3C. The B signals and the A signals held in the latch portions 303 of the pixels in the odd-numbered rows and the pixels in the even-numbered rows are output to the signal processing portion 207 via the data transfer portions 209.

Figure 13A:
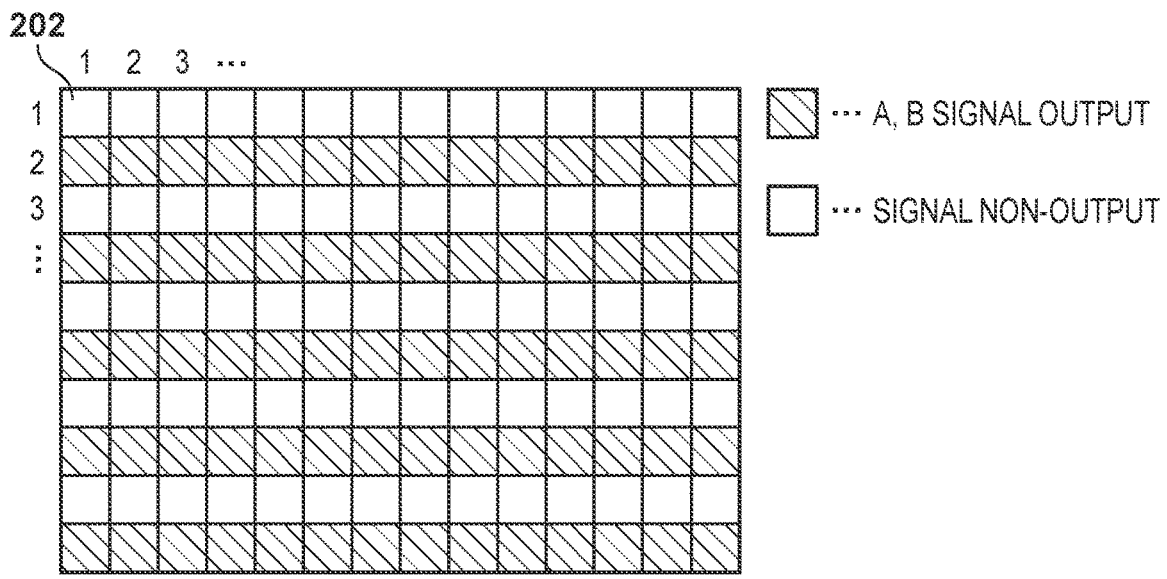
FIGS. 13A and 13B are schematic diagrams illustrating an example of light receiving portions which output an A signal and a B signal when reading out pixels in even-numbered rows in the third readout mode, and AD conversion portions that are used, according to a variation on the first embodiment.
Figure 13B:
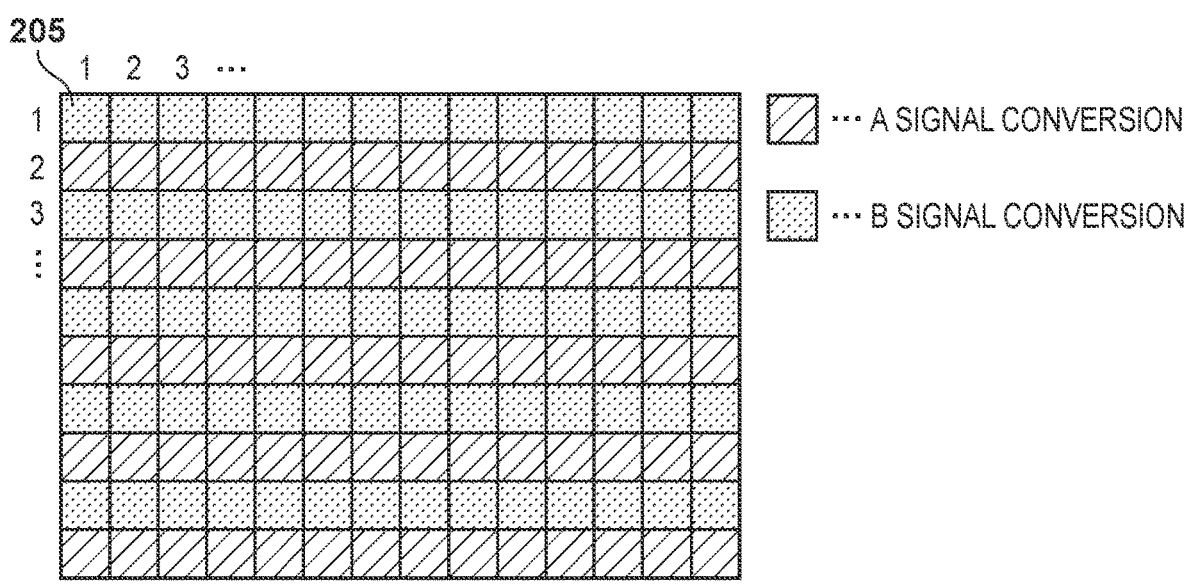

FIGS. 13A and 13B are schematic diagrams illustrating an example of the light-receiving portions 202 that output the A signal and the B signal during operations for reading out from the pixels in the even-numbered rows indicated by times t1007 to t1010, and the AD conversion portions 205 that are used while in the third readout mode. In FIG. 13A, the light-receiving portions 202 filled with oblique lines are light-receiving portions 202 which output the A signal and the B signal. In FIG. 13B, the AD conversion portions 205 filled with oblique lines are AD conversion portions 205 which are used to AD-convert the A signals, whereas the AD conversion portions 205 filled with dots are AD conversion portions 205 which are used to AD-convert the B signals. In the operations for reading out from the pixels in the even-numbered rows, the A signals and B signals are output from the light-receiving portions 202 in the even-numbered rows, the B signals are AD-converted by the AD conversion portions 205 in the odd-numbered rows, and the A signals are AD-converted by the AD conversion portions 205 in the even-numbered rows.

Using the driving illustrated in FIG. 12 makes it possible to AD-convert and output the A signals and the B signals from the pixels in the odd-numbered rows and the even-numbered rows during the third readout mode. At this time, the A signal and the B signal from the same pixel are AD-converted in parallel, and thus no difference between the accumulation timings arises.

Although the present variation describes the differential input switching portion being shared by adjacent pixels in the even-numbered rows and odd-numbered rows in the same column, the combination of pixels sharing the differential input switching portion is not limited thereto. For example, the differential input switching portion may be shared by pixels in the even-numbered columns and odd-numbered columns in the same row. The differential input switching portion may also be shared my more than two pixels. Such a case can be handled by increasing the number of switches for switching the combinations of pixels for the differential pairs.

Second Embodiment

A second embodiment of the present invention will be described next. In the image capturing apparatus according to the second embodiment, each integrated pixel is constituted by a single photodiode (PD) and a single AD conversion portion. Furthermore, in the second embodiment, readout operations for outputting a pixel signal from the photodiode (PD) in each pixel are carried out on an integrated pixel-by-integrated pixel basis as a first readout mode.

As a second readout mode, readout operations are carried out in which the same pixel signal is output from an integrated pixel twice, and those pixel signals are AD-converted and output by two AD conversion portions. According to this configuration, the two pixel signals output from the integrated pixel during the second readout mode can be averaged by the signal processing portion 207 and the like, which makes it possible to reduce noise.

With the image capturing apparatus according to the second embodiment, the second readout mode is used in, for example, a noise reduction mode. The first readout mode is used in, for example, a still image shooting mode or the like.

Figure 14A:
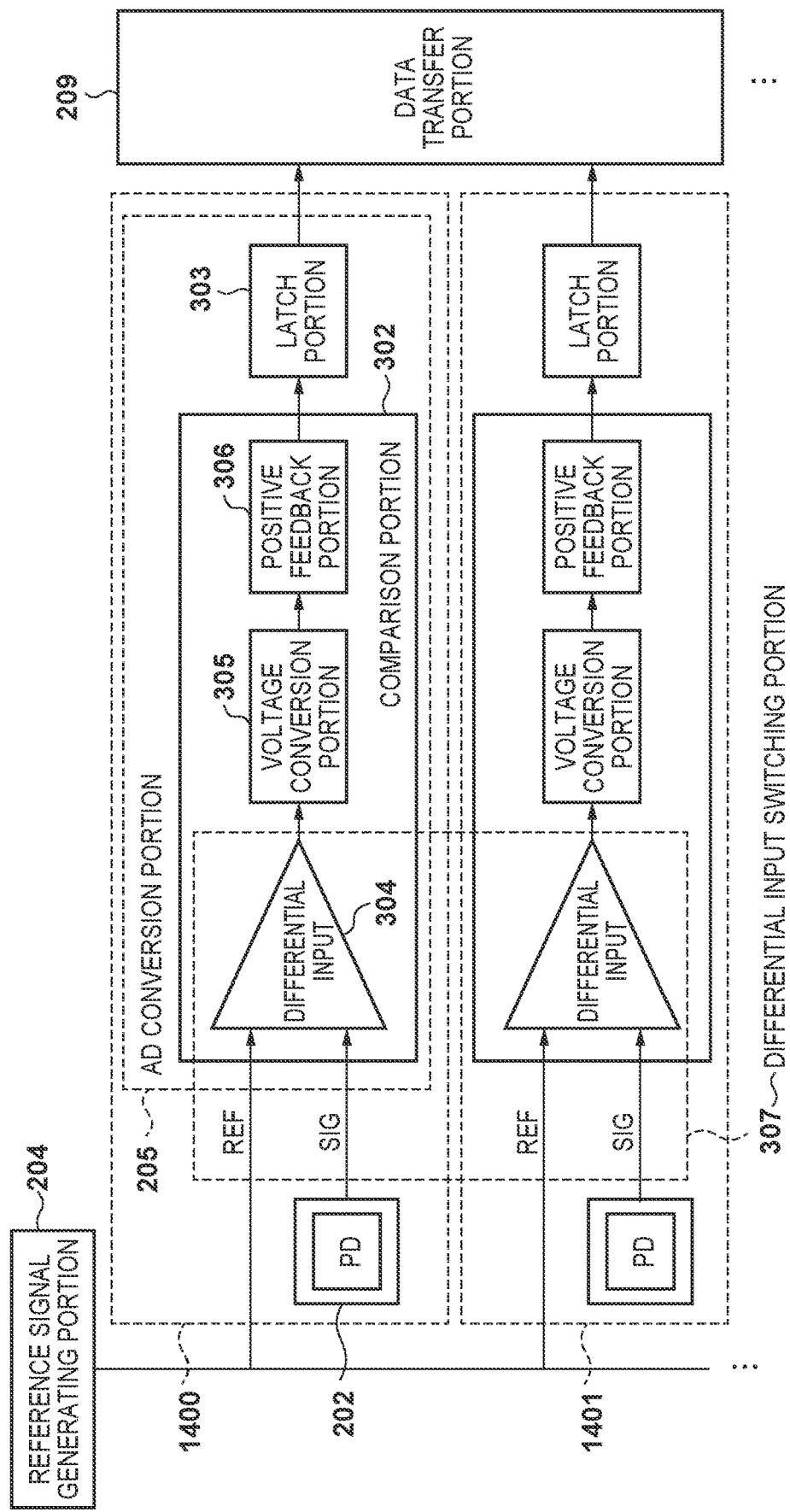
FIGS. 14A and 14B are diagrams schematically illustrating the configuration of an integrated pixel according to a second embodiment.
Figure 14B:
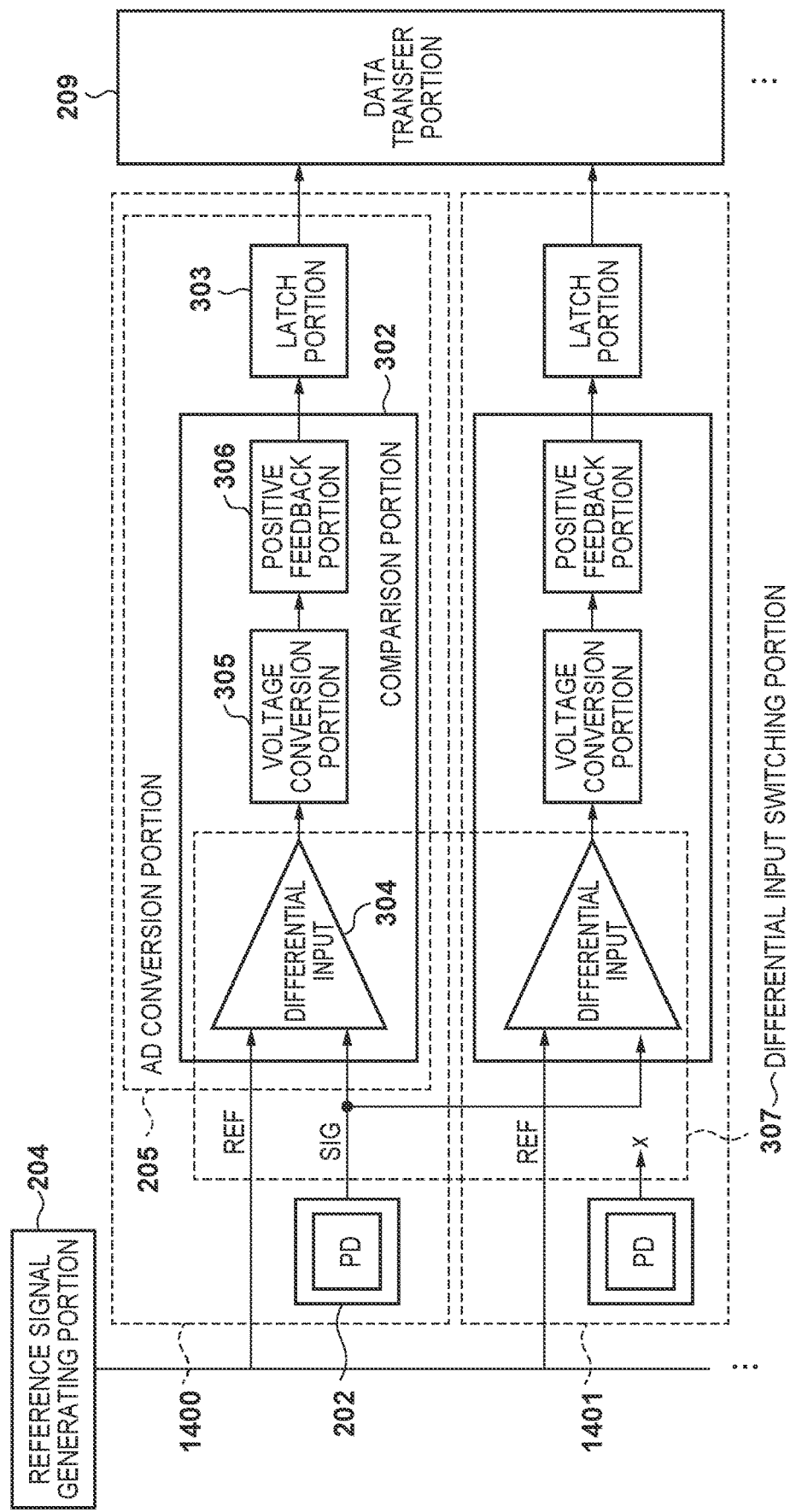

FIGS. 14A and 14B are schematic diagrams illustrating the configurations of two arbitrary integrated pixels 1400 and 1401 according to the second embodiment. FIG. 14A illustrates the connection structure during the first readout mode, and FIG. 14B illustrates the connection structure during the second readout mode. These structures are switched by the differential input switching portion 307.

In FIGS. 14A and 14B, elements that are the same as in FIGS. 3A to 3C are given the same reference signs, and will not be described here. The light-receiving portion 202 of the image sensor according to the second embodiment differs from the configuration illustrated in FIGS. 3A to 3C in that the PDA and the PDB are not present, with the light-receiving portion 202 being constituted by a single photodiode ("PD" hereinafter), and in that a pixel signal SIG of single type is output.

With the configuration used during the first readout mode, illustrated in FIG. 14A, the pixel signal SIG output from the light-receiving portion 202 is input to the differential input portion 304 in the same integrated pixel. On the other hand, with the configuration used during the second readout mode, illustrated in FIG. 14B, the pixel signal SIG output from the light-receiving portion 202 of the integrated pixel 1400 is input to the differential input portion 304 of the integrated pixel 1400 and the differential input portion 304 of the integrated pixel 1401. On the other hand, a pixel signal is not output from the light-receiving portion 202 of the integrated pixel 1401.

Figure 15:
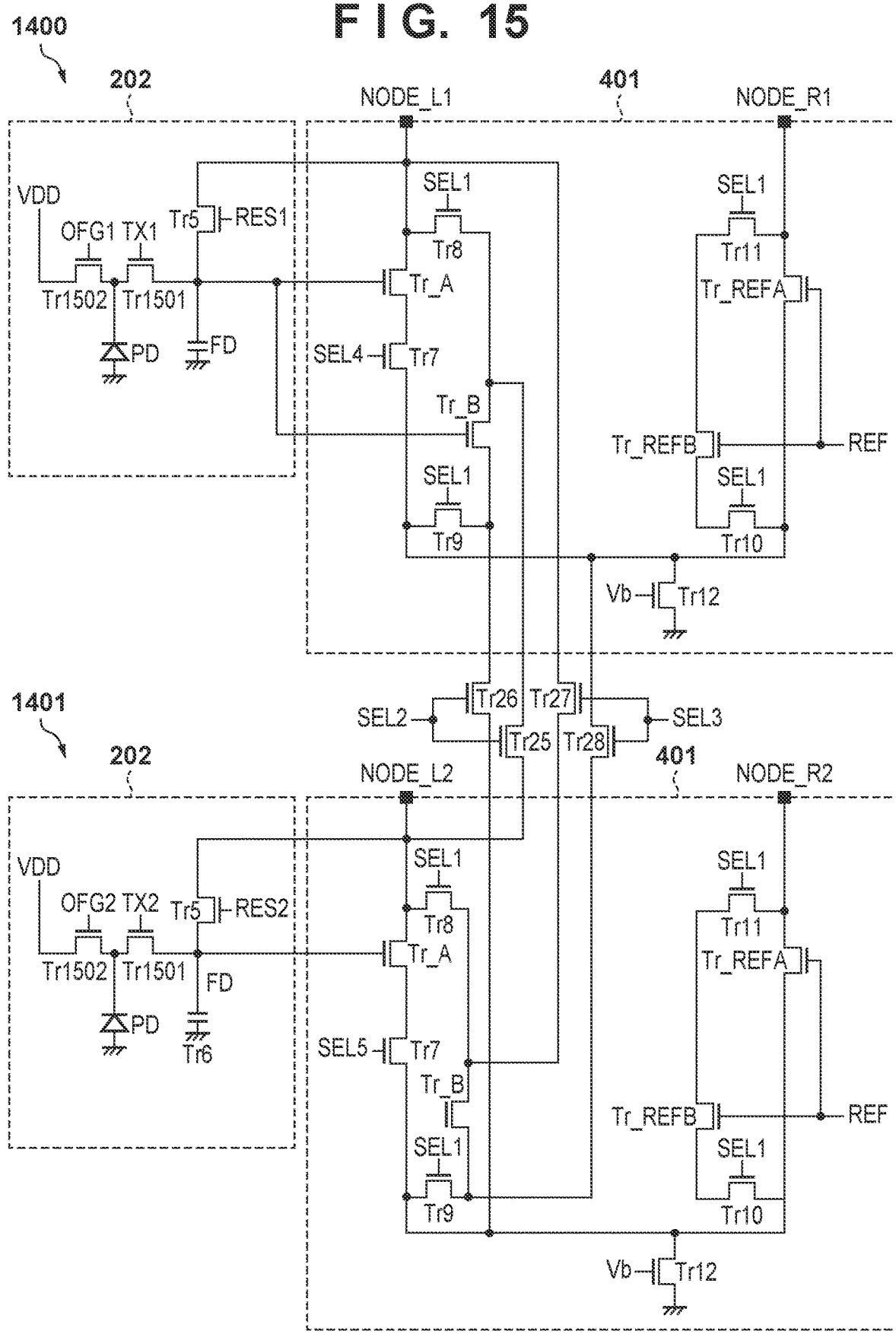
FIG. 15 is a circuit diagram illustrating a configuration of an integrated pixel according to the second embodiment.

FIG. 15 is a circuit diagram illustrating the configuration of the light-receiving portions 202 for the two integrated pixels 1400 and 1401, and of the differential circuit pair 401, which is part of the differential input portion 304. In FIG. 15, elements that are the same as those illustrated in FIG. 4 and described in the first embodiment are given the same reference signs, and will not be described. The configurations of the light-receiving portions 202 and the differential circuit pair 401 will be described first. However, because the integrated pixels 1400 and 1401 have the same configuration, only the integrated pixel 1400 will be described here.

The light-receiving portion 202 includes the PD, a transfer transistor Tr1501, a discharge transistor Tr1502, a reset transistor Try, and a floating diffusion portion ("FD" hereinafter). The PD receives light incident through the shooting lens 102 and generates a signal charge in accordance with the amount of received light. The signal charge generated by the PD is transferred to the FD via the transfer transistor Tr1501, into the gate of which the transfer pulse TX1 has been input. The FD functions as a charge-voltage conversion portion which converts the signal charge transferred from the PD into a voltage signal, and is connected to the gates of the pixel signal transistors Tr_A and Tr_B of the differential circuit pair 401. The configuration of the differential circuit pair 401 is the same as in FIG. 4.

The discharge transistor Tr1502 discharges the signal charge generated by the PD to the drain, and is controlled on and off by the discharge pulse OFG1 input to the gate.

Note that the transfer transistor Tr1501, the discharge transistor Tr1502, and the reset transistor Try of the integrated pixel 1401 are controlled on and off by the transfer pulse TX2, the discharge pulse OFG2, and the reset pulse RES2 input to the respective gates thereof.

As in the first embodiment, in the differential circuit pair 401 of the differential input portion 304, the transistors Tr7 to Tr1*l* and Tr25 to Tr28, which are controlled by the signals SEL1 to SEL5, function as the differential input switching portion 307, which switches the differential input signals illustrated in FIGS. 14A and 14B.

Figure 16:
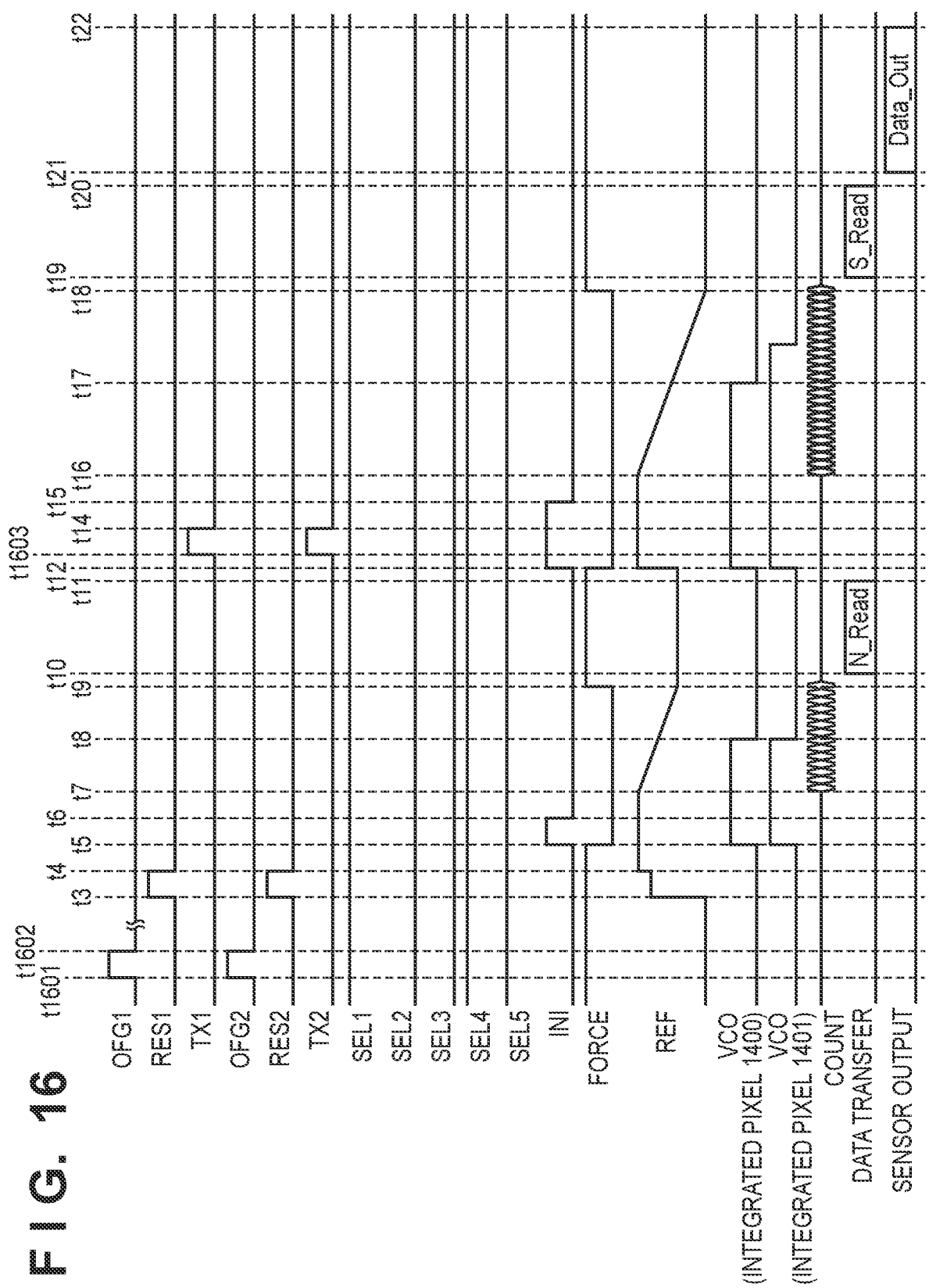
FIG. 16 is a timing chart illustrating a first readout mode according to the second embodiment.

FIG. 16 is a timing chart illustrating the first readout mode according to the second embodiment. Note that in FIG. 16, timings at which the same operations as those described in the first embodiment and illustrated in FIG. 6 are carried out are given the same reference signs, and will not be described.

In the first readout mode, the signals SEL1, SEL4, and SEL5 are set to H and the signals SEL2 and SEL3 are set to L. In this case, in each of the integrated pixels 1400 and 1401, the pixel signal transistors Tr_A and Tr_B connected in parallel, and the reference signal transistors Tr_REFA and Tr_REFB also connected in parallel, form a differential pair. In other words, the connection structure is as illustrated in FIG. 14A.

At time t1601, the discharge pulses OFG1 and OFG2 go to H, the discharge transistor Tr1502 turns on, and the signal charge generated by the PD is discharged to the drain of the discharge transistor Tr1502. At time t1602, the discharge pulses OFG1 and OFG2 go to L, the discharge transistors Tr1502 in the integrated pixels turn off all at once, and the accumulation of signal charges begins for all of the integrated pixels simultaneously.

Then, as in the first embodiment, the FD is reset and the N signal is AD-converted, after which, from time t1603 to t1604, the transfer pulses TX1 and TX2 go from L to H to L in each pixel, resulting in the signal charge which had been accumulated in the PD of each integrated pixel being transferred to the FD. A voltage based on the signal charge which had been accumulated in the PD is then supplied to the gates of the pixel signal transistors Tr_A and Tr_B. As a result, the pixel signal SIG from each pixel is AD-converted and output by the AD conversion portion in the same pixel.

FIG. 17 is a timing chart illustrating the second readout mode according to the second embodiment. Note that in FIG. 17, timings at which the same operations as in the first readout mode illustrated in FIG. 16 are carried out are given the same reference signs, and will not be described.

In the second readout mode, the signals SEL2 and SEL4 are set to H and the signals SEL1, SEL3, and SEL5 are set to L. Accordingly, the pixel signal transistor Tr_A and the reference signal transistor Tr_REFA of the integrated pixel 1400 form a differential pair, and the pixel signal transistor Tr_B of the integrated pixel 1400 and the reference signal transistor Tr_REFA of the integrated pixel 1401 form a differential pair. In other words, the connection structure is as illustrated in FIG. 14B.

At time t1701, the discharge pulses OFG1 and OFG2 go to H, the discharge transistor Tr1502 turns on, and the signal charge generated by the PD is discharged to the drain of the discharge transistor Tr1502. Then, at time t1702, discharge pulse OFG1 goes to L, but OFG2 remains at H. Accordingly, the discharge transistor Tr1502 turns off and the signal charge accumulation starts in the integrated pixel 1400, whereas the discharge transistor Tr1502 remains on, and the discharge of the signal charge to the drain continues as a result, in the integrated pixel 1401.

Then, from time t1703 to t1704, the N signal, which is the reset level signal, is AD-converted. At this time, the differential input portion 304 has the connection structure illustrated in FIG. 14B, and thus the voltage that reset the FD of the integrated pixel 1400 is output as the N signals AD-converted in parallel by the AD conversion portions 205 of the integrated pixels 1400 and 1401.

From time t1705 to t1706, the transfer pulse TX1 goes from L to H to L, and the signal charge accumulated in the PD of the integrated pixel 1400 is transferred to the FD. Signal voltages based on the signal charge transferred to the FD are then AD-converted and output in parallel by the AD conversion portions 205 of the integrated pixels 1400 and 1401, as the S signals, which are the pixel signals.

In this manner, noise can be reduced by the signal processing portion 207 or the like averaging the two sets of N signals and S signals output from the same integrated pixel.

FIG. 18 is a diagram illustrating an example of the configuration of the signal processing portion 207 according to the second embodiment. In FIG. 18, elements that are the same as those illustrated in FIG. 10 are given the same reference signs, and descriptions thereof are omitted as appropriate. The signal processing portion 207 includes memory 1001 and 1802, the S-N portion 1002, the offset/gain correction portion 1003, a correction data selection portion 1801, and an averaging portion 1803.

The pixel signal subjected to CDS processing by the S-N portion 1002 is input to the offset/gain correction portion 1003, which corrects offset shift and gain shift arising due to differences between the characteristics of the AD conversion portions and the like when the AD conversion portions 205 used during the AD conversion are switched. In the present embodiment, different correction data 1 to 3 are used, depending on whether the signal is a pixel signal AD-converted in the first readout mode, a pixel signal AD-converted by the integrated pixel 1400 in the second readout mode, or a pixel signal AD-converted by the integrated pixel 1401 in the second readout mode. The correction data selection portion 1801 selects one of the correction data 1 to 3 on the basis of a correction data selection signal and supplies the selected data to the offset/gain correction portion 1003. The memory 1802 temporarily holds the two pixel signals output from the same integrated pixel during the second readout mode. The averaging portion 1803 takes, as an input, the two pixel signals from the same pixel, held in the memory 1802 (called "Pix1" and "Pix2" here), carries out an averaging process ((Pix1+Pix2)/2), and outputs the result. Noise can be reduced through this process. Note that the pixel signal output in the first readout mode is output without going through the memory 1802 and the averaging portion 1803.

In the second embodiment, during the second readout mode, the reference signal REF generated by the same reference signal generating portion 204 is supplied to the differential input portions 304 of the integrated pixels 1400 and 1401, as illustrated in FIG. 14B. However, reference signals having the same slope but that have been generated by different reference signal generating portions 204 may be input to the respective differential input portions 304. This makes it possible to reduce the influence of noise fluctuations in the reference signal when the averaging portion 1803 averages the pixel signals AD-converted by the two AD conversion portions 205 in the integrated pixels 1400 and 1401.

As described thus far, according to the second embodiment, using the first readout mode when shooting a normal still image makes it possible to accumulate charges in all integrated pixels simultaneously and AD-convert the obtained pixel signals in parallel, which enables shooting through the global shutter method.

On the other hand, during a noise reduction mode, using the second readout mode makes it possible to AD-convert and output two pixel signals, which have been output from the same integrated pixel, in parallel, by using the AD conversion portion of an integrated pixel from which a pixel signal is not read out. At this time, the accumulation timings of the two output pixel signals are the same, and thus a favorable averaging process can be carried out for moving objects as well.

The above-described configuration and control makes it possible to achieve both the first readout mode, in which a single pixel signal is output from each integrated pixel, and the second readout mode, in which a plurality of pixel signals are output from one integrated pixel, while suppressing a major increase in the circuit scale of the AD conversion portions.

Note that two pixel signals may be output from each of all the pixels by shifting the timings of AD conversion between the even-numbered rows and the odd-numbered rows, as described in the variation on the first embodiment (the third readout mode).

Additionally, the control may be switched for the integrated pixel 1400 and the integrated pixel 1401, described above with reference to FIG. 17, by setting the signals SEL3 and SEL5 to H and the signals SEL1, SEL2, and SEL4 to L. Carrying out such control makes it possible to read out the signals from the PD of the integrated pixel 1401 while reducing noise.

Third Embodiment

A third embodiment of the present invention will be described next. In the image capturing apparatus according to the third embodiment, each integrated pixel is constituted by a single photodiode (PD) and a single AD conversion portion, as in the second embodiment. Furthermore, as in the second embodiment, readout operations for outputting a pixel signal from the photodiode (PD) in each pixel are carried out on an integrated pixel-by-integrated pixel basis as a first readout mode.

As a second readout mode, driving is carried out in which two of the same pixel signal are output from the integrated pixel, and these pixel signals are compared to reference signals swept at mutually-different slopes, and AD-converted, using two AD conversion portions. This makes it possible to increase the detection resolution of small signals and improve the dynamic range.

Figure 19A:
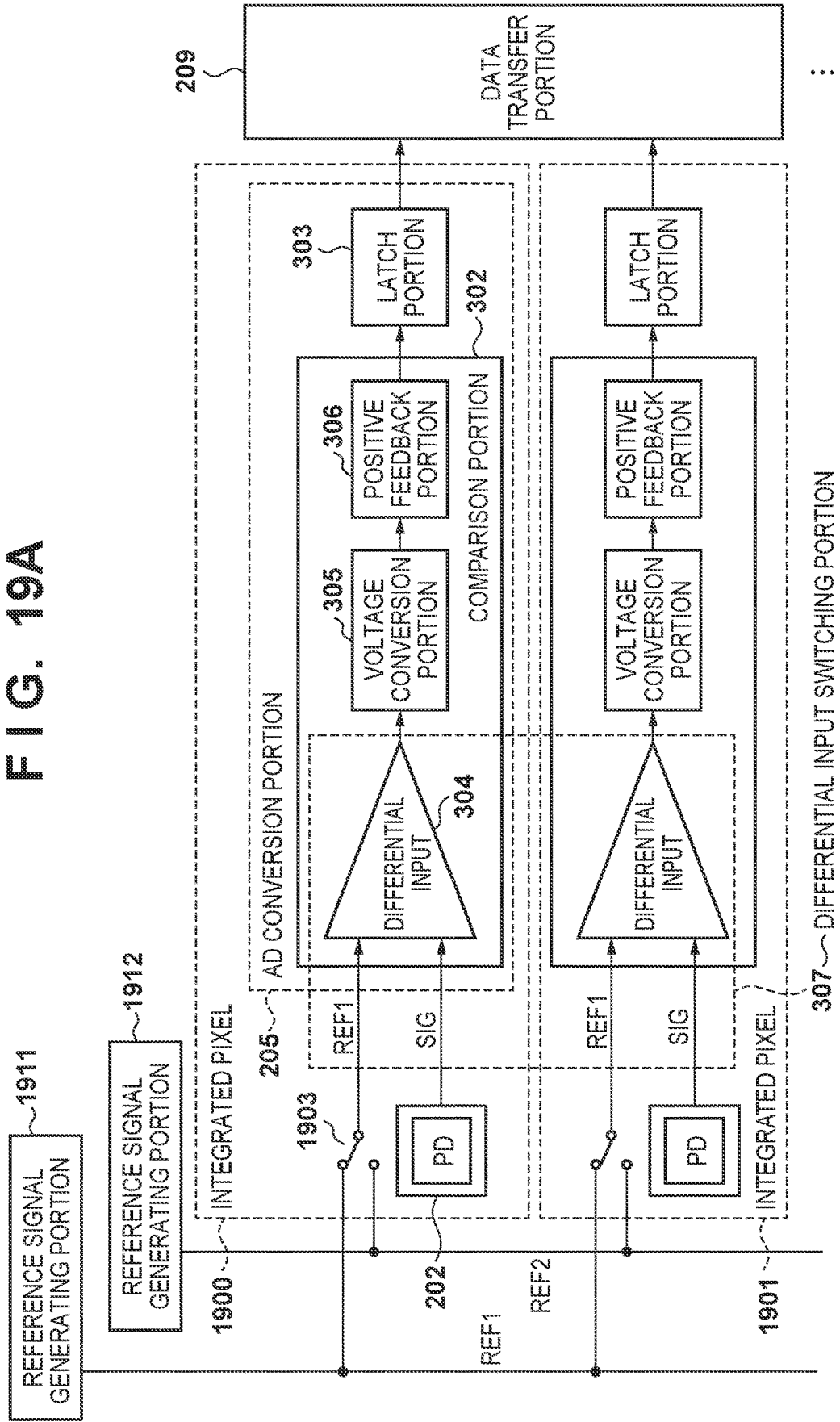
FIGS. 19A and 19B are diagrams schematically illustrating a configuration of an integrated pixel according to a third embodiment.
Figure 19B:
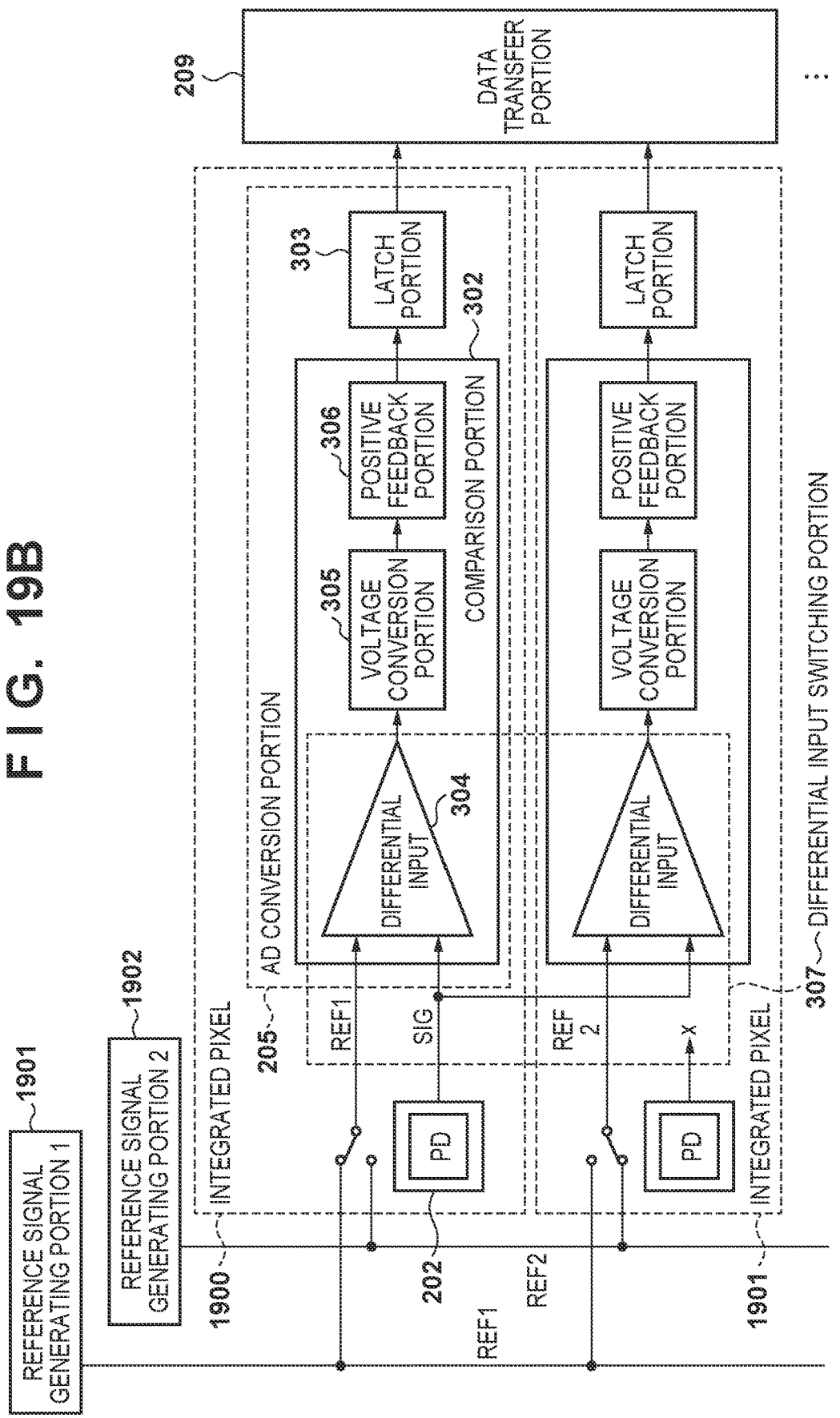

FIGS. 19A and 19B are schematic diagrams illustrating the configurations of two arbitrary integrated pixels 1900 and 1901 according to the third embodiment. FIG. 19A illustrates the connection structure during the first readout mode, and FIG. 19B illustrates the connection structure during the second readout mode. These structures are switched by the differential input switching portion 307.

The configuration illustrated in FIG. 19A differs from the configuration described in the second embodiment with reference to FIG. 14A in the following ways. Two reference signal generating portions 1911 and 1912 are provided in the image sensor 100, and furthermore, a reference signal selection portion 1903 that switches the reference signals supplied from the reference signal generating portions 1911 and 1912 is provided. Other configurations are the same as those illustrated in FIGS. 14A and 14B, and are therefore given the same reference signs and will not be described.

The reference signal selection portion 1903 switches the reference signal supplied to the differential input portion 304. Reference signals REF1 and REF2, which are swept at mutually-different slopes, are supplied to the reference signal selection portion 1903 from the two reference signal generating portions 1911 and 1912 provided in the image sensor 100. The reference signal selection portion 1903 supplies one of the reference signals REF1 and REF2 to the differential input portion 304 in accordance with a reference signal selection signal (not shown) supplied from the pixel control portion 203.

With the connection structure used during the first readout mode, illustrated in FIG. 19A, the pixel signal SIG output from the light-receiving portion 202 is input to the differential input portion 304 in the same integrated pixel. Additionally, the reference signal REF1 is input to both the integrated pixels 1900 and 1901 by the reference signal selection portion 1903.

On the other hand, with the connection structure used during the second readout mode, illustrated in FIG. 19B, the pixel signal SIG output from the light-receiving portion 202 of the integrated pixel 1900 is input to the differential input portion 304 of the integrated pixel 1900 and the differential input portion 304 of the integrated pixel 1901. A pixel signal is not output from the light-receiving portion 202 of the integrated pixel 1901. Additionally, the reference signal REF1 is input to the differential input portion 304 of the integrated pixel 1900, and the reference signal REF2 is input to the differential input portion 304 of the integrated pixel 1901, by the reference signal selection portion 1903.

The detailed circuit configurations of the light-receiving portions 202 and the differential input portions 304 of the integrated pixels 1900 and 1901 are the same as the configurations described in the second embodiment with reference to FIG. 15 and will therefore not be described here. However, as described above, the reference signals input to the transistors Tr_REFA and TR_REFB are one of the reference signals REF1 and REF2 selected by the reference signal selection portion 1903.

Timing control according to the third embodiment will be described next. Note that the timings in the first readout mode according to the third embodiment are the same as the timings in the first readout mode according to the second embodiment and illustrated in FIG. 16, and will therefore not be described here.

Figure 20:
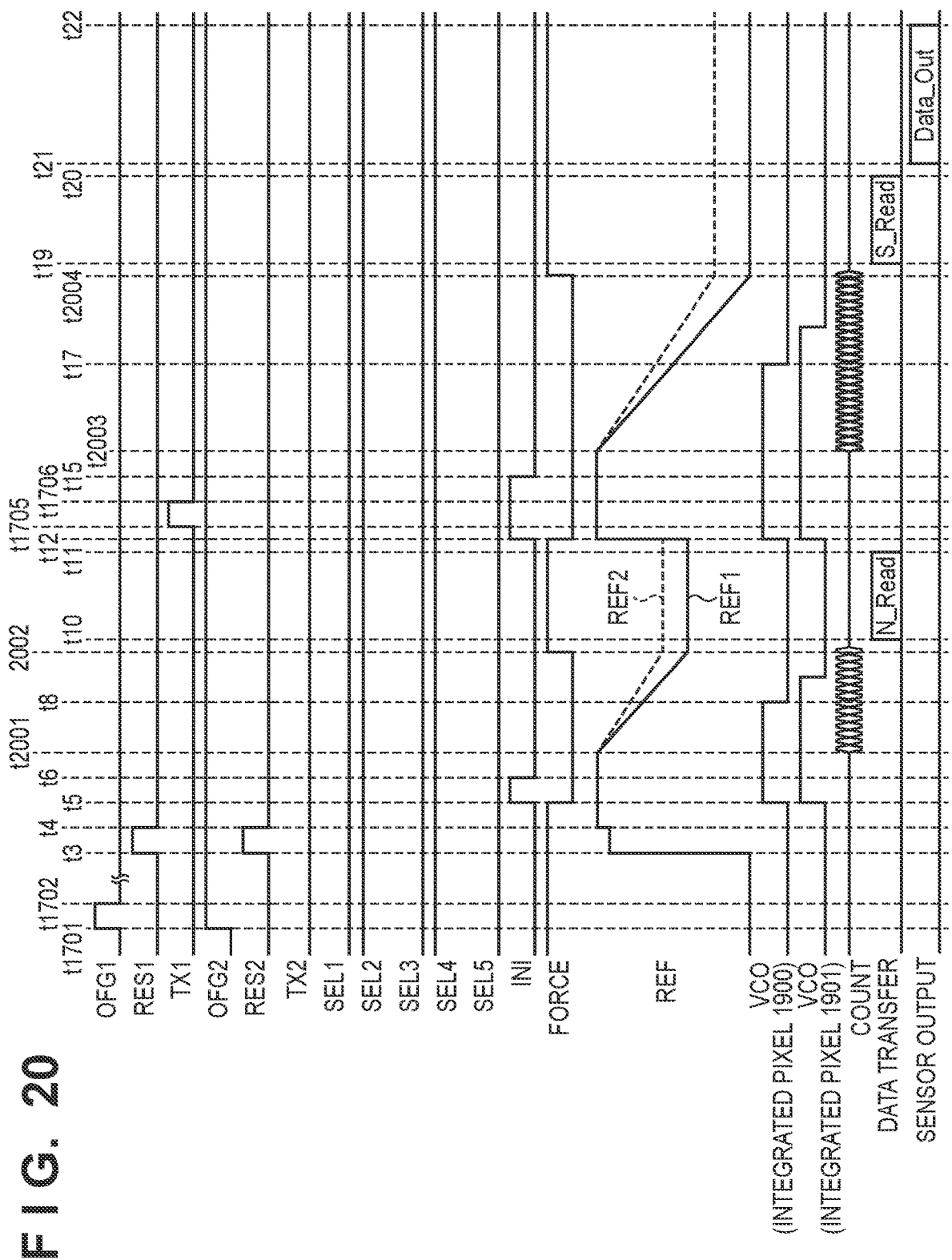
FIG. 20 is a timing chart illustrating a second readout mode according to the third embodiment.

FIG. 20 is a timing chart illustrating the second readout mode according to the third embodiment. Note that in FIG. 20, timings at which the same operations as in the second readout mode described in the second embodiment with reference to FIG. 17 are carried out are given the same reference signs, and will not be described.

In the second readout mode, the reference signal REF1, indicated by the solid line, and the reference signal REF2, indicated by the dot-dash line, are supplied, and comparison operations are carried out, during the N conversion period indicated by time t2001 to t2002 and the S conversion period indicated by time t2003 to t2004.

Here, in the second readout mode, the connection structure illustrated in FIG. 19B is achieved by setting the signals SEL2 and SEL4 to H and the signals SEL1, SEL3, and SEL5 to L. Accordingly, the pixel signal SIG from the light-receiving portion 202 in the integrated pixel 1900, and the reference signal REF1, are supplied to the differential input portion 304 of the integrated pixel 1900, and operations for comparing the two are carried out. Likewise, the pixel signal SIG from the light-receiving portion 202 in the integrated pixel 1900, and the reference signal REF2, are supplied to the differential input portion 304 of the integrated pixel 1901, and operations for comparing the two are carried out.

The reference signal REF2 has a lower sweeping speed (timewise change in voltage) than the reference signal REF1. As such, the AD conversion portion 205 in the integrated pixel 1901, which carries out the comparison with the reference signal REF2, can carry out the conversion at a finer resolution than with the reference signal REF1, when the pixel signal is a small signal. On the other hand, the AD conversion portion 205 in the integrated pixel 1900, which carries out the comparison with the reference signal REF1, can carry out the AD conversion for a broader pixel signal range than the AD conversion portion 205 in the integrated pixel 1901, which uses the reference signal REF2.

Thus the image signals are combined by using a signal converted by the AD conversion portion 205 in the integrated pixel 1901 when the signal level of the pixel signal is low, and using a signal converted by the AD conversion portion 205 in the integrated pixel 1900 when the signal level of the pixel signal is high. This makes it possible to increase the detection resolution when the signal level is low and improve the dynamic range.

Figure 21:
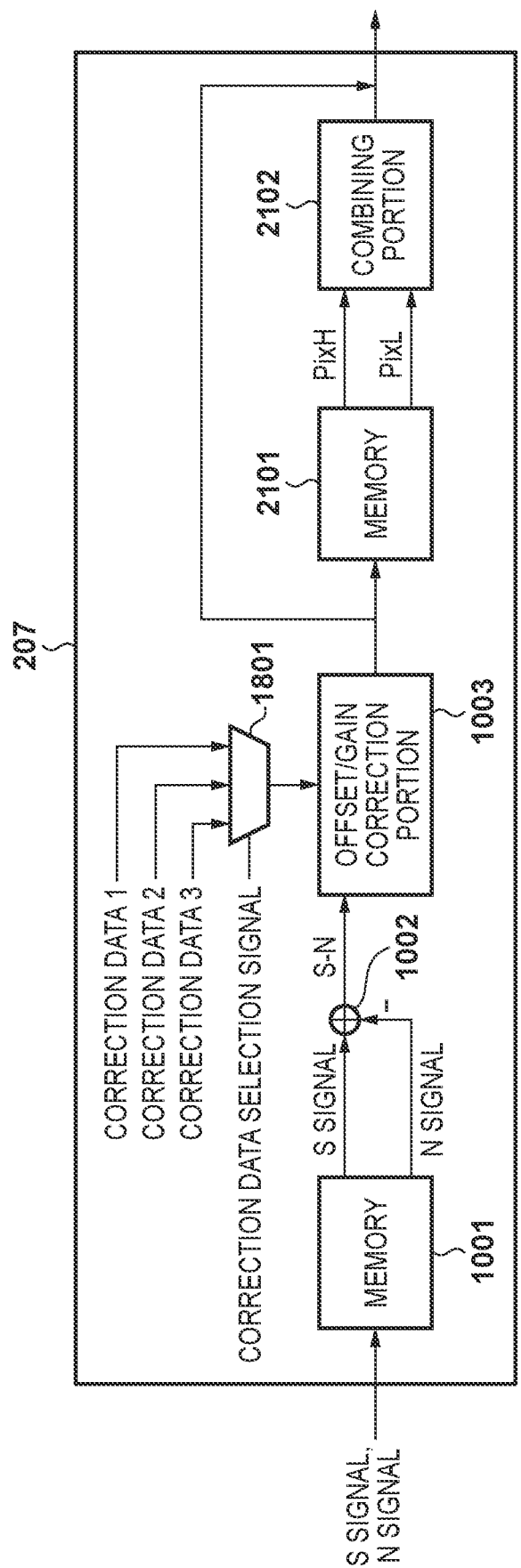
FIG. 21 is a block diagram illustrating an overall configuration of a signal processing portion according to the third embodiment.

FIG. 21 is a diagram illustrating an example of the configuration of the signal processing portion 207 according to the third embodiment. In FIG. 21, elements that are the same as those illustrated in FIG. 18 and described in the second embodiment are given the same reference signs, and will not be described. The signal processing portion 207 includes memory 1001 and 2101, the S-N portion 1002, the offset/gain correction portion 1003, the correction data selection portion 1801, and a combining portion 2102.

A pixel signal PixH, produced through AD conversion using the reference signal REF1 corrected by the offset/gain correction portion 1003, and a pixel signal PixL, produced through AD conversion using the reference signal REF2 corrected by the offset/gain correction portion 1003, are temporarily held in the memory 2101. The pixel signals PixH and PixL from the same pixel are input to the combining portion 2102, and a combined signal is output.

For example, when the signal level of the pixel signal is low, i.e., when the pixel signal PixL is not saturated, a value obtained by multiplying the value of the pixel signal PixL by a predetermined correction coefficient is output as the output signal. On the other hand, when the signal level of the pixel signal is high, i.e., when the pixel signal PixL is saturated, a value obtained by multiplying the value of the pixel signal PixH by a different correction coefficient from that used with the pixel signal PixL is output as the output signal. This processing makes it possible to increase the detection resolution when the signal level is low and improve the dynamic range.

Note that the correction process carried out by the signal processing portion 207 may instead be carried out by the signal processing portion 101 or the central control/processing portion 104 illustrated in FIG. 1.

As described thus far, according to the third embodiment, the second readout mode is used during a high-dynamic range mode, for example. As a result, two pixel signals output from the same integrated pixel can be AD-converted and output in parallel, at different detection resolutions and detection ranges, by using the AD conversion portions of integrated pixels from which pixel signals are not read out. At this time, the accumulation timings of the two output pixel signals are the same, and thus a dynamic range expansion process can be carried out for moving objects as well.

The above-described configuration and control makes it possible to achieve both the first readout mode, in which a single pixel signal is output from each integrated pixel, and the second readout mode, in which a plurality of pixel signals are output from one integrated pixel, while suppressing a major increase in the circuit scale of the AD conversion portions.

During the second readout mode, two pixel signals may be output from all the pixels, and AD-converted and output in parallel at different detection resolutions and detection ranges, by shifting the AD conversion timings between the even-numbered rows and the odd-numbered rows, as described in the variation on the first embodiment.

Additionally, the control may be switched for the integrated pixel 1900 and the integrated pixel 1901, described above with reference to FIG. 19B, by setting the signals SEL3 and SEL5 to H and the signals SEL1, SEL2, and SEL4 to L. Even with such control, processing for expanding the dynamic range can be carried out.

Fourth Embodiment

A fourth embodiment of the present invention will be described next. In the foregoing first to third embodiments, the pixel signals input to the differential input portion 304 are switched using the differential input switching portion 307. However, the fourth embodiment will describe a case where a switching portion having a different configuration is used. Note that the overall configuration of the integrated pixel is the same as that illustrated in FIGS. 3A to 3C, and will therefore not be described here.

Figure 22:
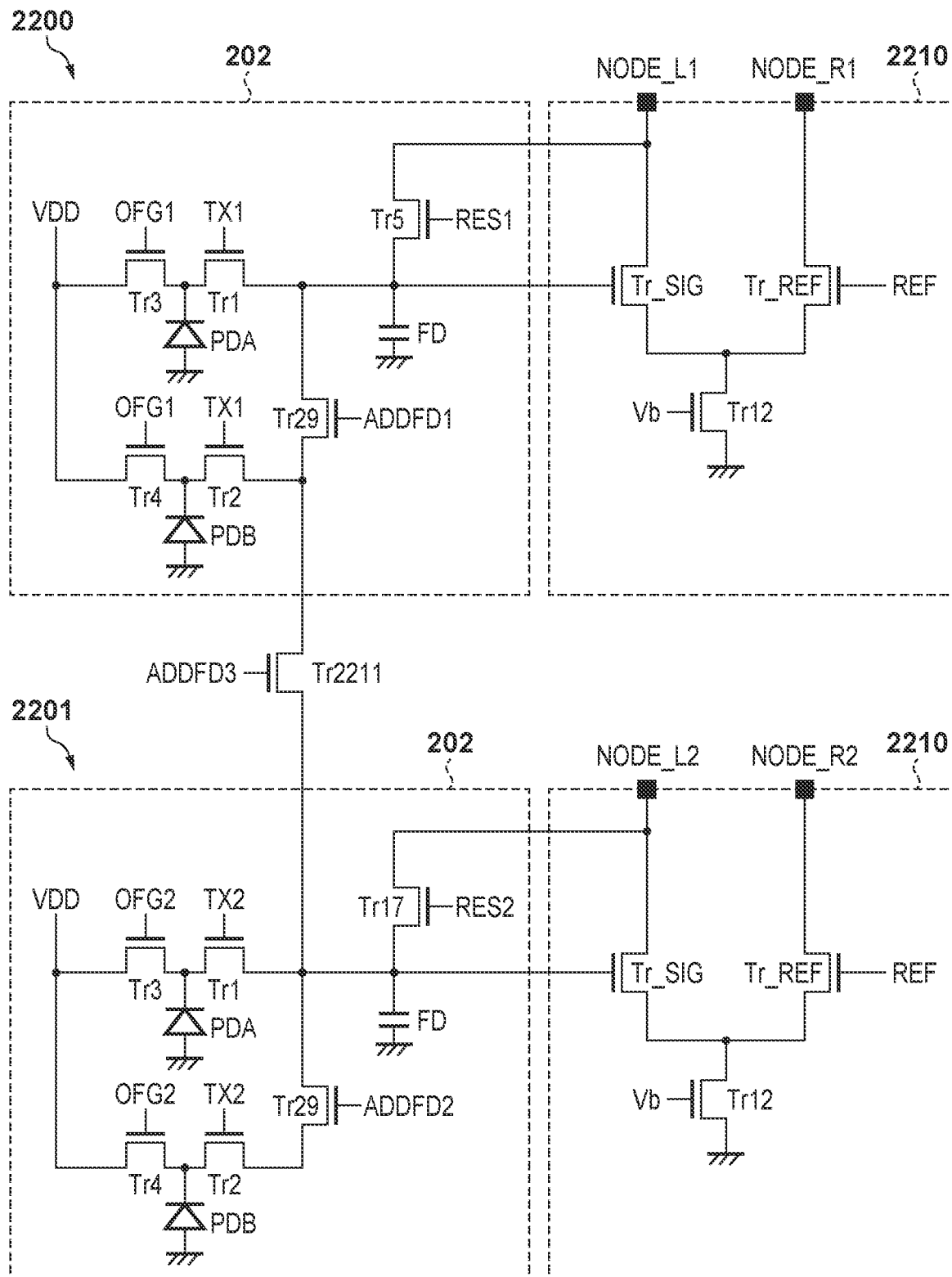
FIG. 22 is a circuit diagram illustrating a configuration of an integrated pixel according to a fourth embodiment.

FIG. 22 is a circuit diagram illustrating the configurations of light-receiving portions 202, as well as of a differential circuit pair 2210 constituting part of the differential input portion 304, in two integrated pixels 2200 and 2201 according to the fourth embodiment. In FIG. 22, elements that are the same as those illustrated in FIG. 4 and described in the first embodiment are given the same reference signs, and will not be described. The configurations of the integrated pixels 2200 and 2201 are also the same, and thus only the integrated pixel 2200 will be described here.

In the differential circuit pair 2210 of the differential input portion 304, the pixel signal transistor Tr_SIG, the gate of which is connected to the photodiode (FD), and the reference signal transistor Tr_REF, to the gate of which the reference signal REF is input, constitute a differential pair. The transistors Tr51 and Tr52 constituting the current mirror illustrated in FIG. 5 are connected to the NODE_L1 and the NODE_R1. Note that the block indicated by 401 in FIG. 5 corresponds to 2210 in FIG. 22.

A transistor Tr2211 provided between the integrated pixel 2200 and the integrated pixel 2201 is used to transfer the signal charge generated by the PDB of the integrated pixel 2200 to the FD of the integrated pixel 2201, and is controlled by a mixing pulse ADDFD3 input to its gate.

With the mixing pulse ADDFD3 at H and the transistor Tr2211 on, and the mixing pulses ADDFD1 and ADDFD2 at L and the transistor Tr29 off, setting the transfer pulse TX1 to H and turning the transfer transistors Tr1 and Tr2 of the integrated pixel 2200 on makes it possible to transfer the signal charge generated by the PDB of the integrated pixel 2200 to the FD of the integrated pixel 2201. As a result, in the differential input portion 304 of the integrated pixel 2201, the B signal from the integrated pixel 2200 can be compared with the reference signal REF.

Additionally, the signal charge generated by the PDA of the integrated pixel 2200 can be transferred to the FD in response to the transfer transistor Tr1 turning on. As a result, in the differential input portion 304 of the integrated pixel 2200, the A signal from the integrated pixel 2200 can be compared with the reference signal REF. Accordingly, these provide the same connection structure as that illustrated in FIG. 3B, described in the first embodiment.

Additionally, with the mixing pulse ADDFD3 at L and the transistor Tr2211 off, and the mixing pulses ADDFD1 and ADDFD2 at H and the transistor Tr29 on, turning the transfer transistors Tr1 and Tr2 of the integrated pixels 2200 and 2201 on makes it possible to transfer the signal charges generated by the PDA and the PDB of the integrated pixel 2200 to the FD of the integrated pixel 2200, and to transfer the signal charges generated by the PDA and the PDB of the integrated pixel 2201 to the FD of the integrated pixel 2201.

As a result, in the differential input portion 304 of the integrated pixel 2200, the A+B signal from the integrated pixel 2200 can be compared with the reference signal REF, and in the differential input portion 304 of the integrated pixel 2201, the A+B signal from the integrated pixel 2201 can be compared with the reference signal REF. This provides the same connection structure as that illustrated in FIG. 3A, described in the first embodiment.

Accordingly, the transistors Tr29 and Tr2211, which are controlled by the mixing pulses ADDFD1, ADDFD2, and ADDFD3, function as the differential input switching portion 307, which switches the pixel signal input to the differential input portion 304.

Figure 23:
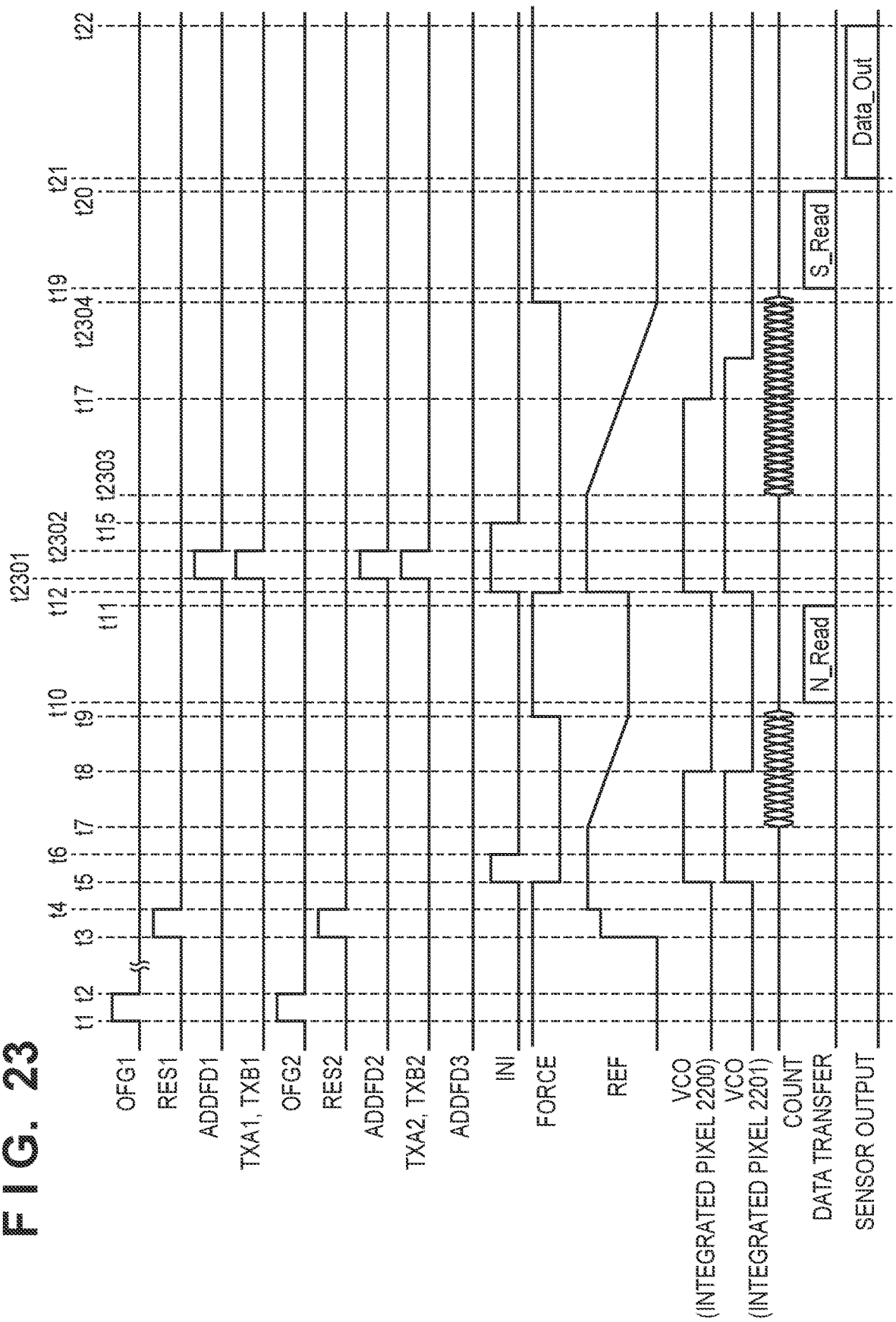
FIG. 23 is a driving timing chart illustrating a first readout mode according to the fourth embodiment.
Figure 24:
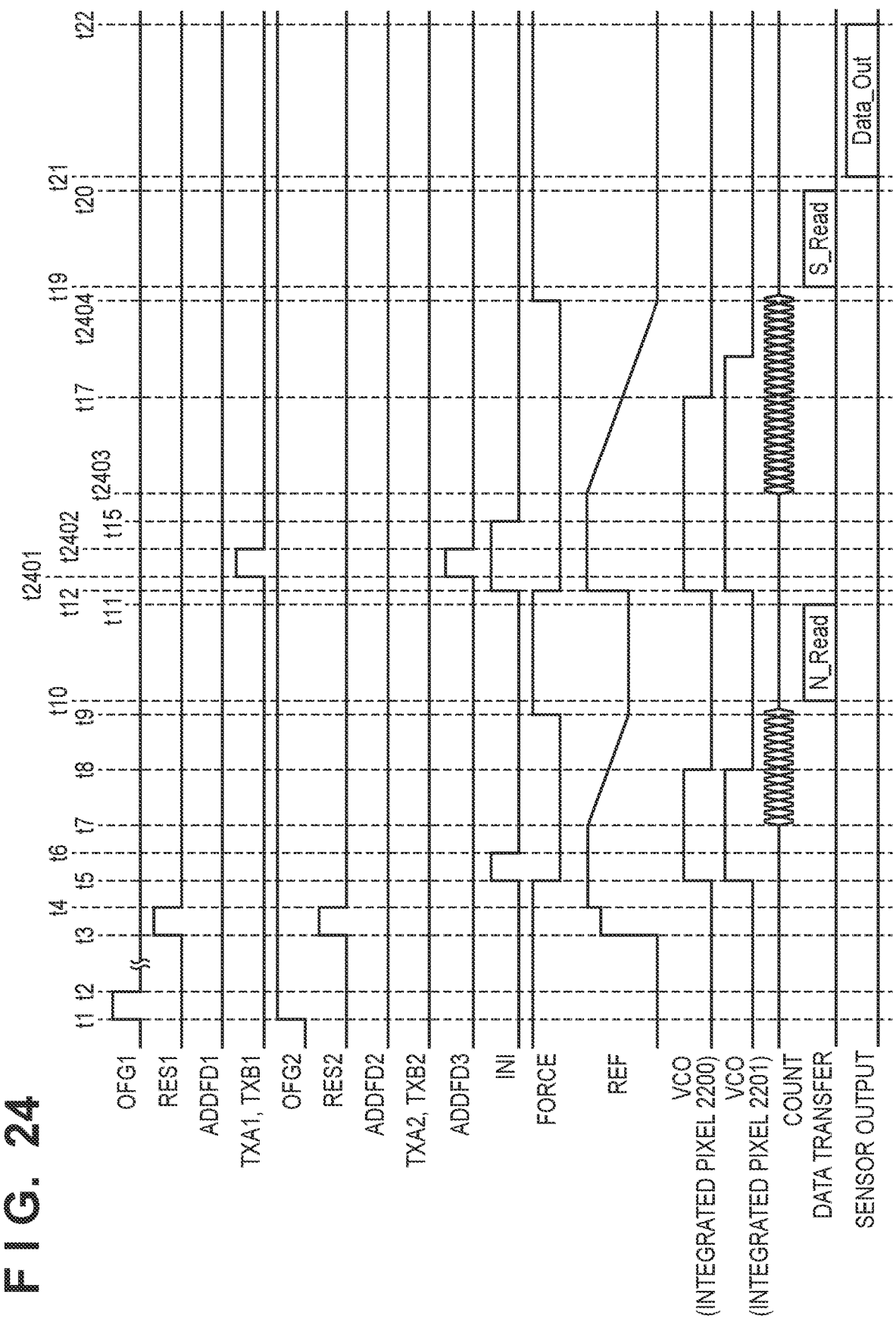
FIG. 24 is a driving timing chart illustrating a second readout mode according to the fourth embodiment.

FIGS. 23 and 24 are timing charts illustrating the first and second readout modes, respectively, according to the fourth embodiment. Note that in FIG. 23, timings at which the same operations as the driving timings described in the first embodiment and illustrated in FIG. 6 are carried out are given the same reference signs, and will not be described.

In the first readout mode illustrated in FIG. 23, from time t2301 to t2302, the transfer pulses TX1 and TX2 goes from L to H to L, and when the signal charges from the PDA and the PDB are transferred, the mixing pulses ADDFD1 and ADDFD2 also go from L to H to L. Additionally, the mixing pulse ADDFD3 remains at L, and thus the connection structure is as illustrated in FIG. 3A. As such, the signal charges generated by the PDA and the PDB are transferred to the FD in each integrated pixel. Thus during the S conversion period from time t2303 to t2304, the A+B signal from the light-receiving portion of each pixel is AD-converted using the AD conversion portion 205 within the same pixel.

In the second readout mode illustrated in FIG. 24, from time t2401 to t2402, the transfer pulse TX1 supplied to the transfer transistors Tr1 and Tr2 of the integrated pixel 2200 goes from L to H to L. At this time, the mixing pulse ADDFD3 goes from L to H to L, while the mixing pulses ADDFD1 and ADDFD2, and the transfer pulse TX2, remain at L, and thus the connection structure is that illustrated in FIG. 3B. Accordingly, the signal charge generated by the PDA is transferred to the FD of the integrated pixel 2200, and the signal charge generated by the PDB of the integrated pixel 2200 is transferred to the FD of the integrated pixel 2201.

Because the discharge pulse OFG2 is H, and the discharge transistors Tr3 and Tr4 are on, the signal charges generated by the PDA and the PDB of the integrated pixel 2201 are discharged to the drains of the discharge transistors Tr3 and Tr4. Thus in the S conversion period from time t2403 to t2404, the A signal output from the light-receiving portion 202 of the integrated pixel 2200 is AD-converted by the AD conversion portion 205 of the integrated pixel 2200, and the B signal output from the light-receiving portion 202 of the integrated pixel 2200 is AD-converted by the AD conversion portion 205 of the integrated pixel 2201.

As described thus far, according to the fourth embodiment, using the first readout mode when shooting a still image makes it possible to accumulate charges in all integrated pixels simultaneously and AD-convert the obtained pixel signals in parallel, in the same manner as in the first embodiment. In other words, shooting can be carried out using the global shutter method. On the other hand, using the second readout mode during focus detection makes it possible to AD-convert the A signal and the B signal in parallel additionally using the AD conversion portions of the integrated pixels from which pixel signals are not read out. The accumulation times of the A signal and the B signal can thus be matched.

The above-described configuration and control makes it possible to achieve both the first readout mode, in which a single pixel signal is output from each integrated pixel, and the second readout mode, in which a plurality of pixel signals are output from one integrated pixel, while suppressing a major increase in the circuit scale of the AD conversion portions.

Note that during the second readout mode, two pixel signals may be output from all the pixels by shifting the timings of AD conversion between the even-numbered rows and the odd-numbered rows, as described in the variation on the first embodiment (the third readout mode).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-221680, filed on Nov. 27, 2018 which is hereby incorporated by reference herein in its entirety.

What is claimed is:

1. An image sensor comprising,
a plurality of pixels, each pixel including a light-receiving portion that outputs an electrical signal obtained by photoelectrically converting incident light and an A/D converter that AD-converts the electrical signal, the plurality of pixels configured to be capable of AD-converting a signal output from the light-receiving portion of a first pixel, among a predetermined plurality of pixels, using the A/D converter of another pixel, every said predetermined plurality of pixels; and
a selection circuit that selects a pixel to AD-convert the electrical signal output from the light-receiving portion of the first pixel, every said predetermined plurality of pixels,
wherein the A/D converters of the predetermined plurality of pixels carry out the AD conversion in parallel, and
wherein the light-receiving portion of the first pixel includes two photoelectric conversion portions that photoelectrically convert incident light;
the selection circuit:
selects the A/D converter of the first pixel as the A/D converter for AD-converting the electrical signals obtained from the two photoelectric conversion portions of the first pixel, by controlling the electrical signals output from the light-receiving portion to be AD-converted by the A/D converter on a pixel-by-pixel basis, in a first mode, and
selects the A/D converter of the first pixel as the A/D converter for AD-converting the electrical signal obtained from one of the two photoelectric conversion portions, and selects the A/D converter of a second pixel, which is different from the first pixel, as the A/D converter for AD-converting the electrical signal obtained from the other of the two photoelectric conversion portions, in a second mode; and
the image sensor further comprises a control circuit that carries out control so that in the second mode, the electrical signal output from the light-receiving portion of the second pixel is not input to the A/D converter.

2. The image sensor according to claim 1,
wherein in the first mode, a signal obtained by mixing the electrical signals obtained from the two photoelectric conversion portions is AD-converted by the A/D converter.

3. An image sensor comprising,
a plurality of pixels, each pixel including a light-receiving portion that outputs an electrical signal obtained by photoelectrically converting incident light and an A/D converter that AD-converts the electrical signal, the plurality of pixels configured to be capable of AD-converting a signal output from the light-receiving portion of a first pixel, among a predetermined plurality of pixels, using the A/D converter of another pixel, every said predetermined plurality of pixels; and
a selection circuit that selects a pixel to AD-convert the electrical signal output from the light-receiving portion of the first pixel, every said predetermined plurality of pixels,
wherein the A/D converters of the predetermined plurality of pixels carry out the AD conversion in parallel, and
wherein the selection circuit:
selects the A/D converter of the first pixel as the A/D converter for AD-converting the electrical signal obtained from the first pixel by controlling the electrical signal output from the light-receiving portion to be AD-converted by the A/D converter on a pixel-by-pixel basis, in a first mode, and
selects the A/D converter of the first pixel and the A/D converter of a second pixel, which is different from the first pixel, in a second mode; and
the image sensor further comprises a control circuit that carries out control so that in the second mode, the electrical signal output from the light-receiving portion of the second pixel is not input to the A/D converter.

4. The image sensor according to claim 3, further comprising:
a processing circuit that processes a digital signal output from the A/D converter of each pixel,
wherein in the second mode, the processing circuit carries out a process of averaging the digital signals output from the A/D converters of the first pixel and the second pixel.

5. The image sensor according to claim 3, further comprising:
a supply circuit that supplies a plurality of different reference signals to the A/D converters; and
switching circuits that select one of the plurality of reference signals and input the selected reference signal to the A/D converters,
wherein the switching circuits:
select one reference signal and input the selected reference signal to the A/D converter of each pixel, in the first mode; and
select and input a first reference signal, among the plurality of reference signals, as the reference signal to be input to the A/D converter of the first pixel, and select and input a second reference signal, among the plurality of reference signals, which is different from the first reference signal, as the reference signal to be input to the A/D converter of the second pixel, in the second mode.

6. The image sensor according to claim 5, further comprising:
a processing circuit that processes a digital signal output from the A/D converter of each pixel,
wherein in the second mode, the processing circuit carries out a process of expanding the dynamic range using the digital signals output from the A/D converters of the first pixel and the second pixel.

7. An image capturing apparatus comprising:
an image sensor including a plurality of pixels and a selection circuit, each pixel including a light-receiving portion that outputs an electrical signal obtained by photoelectrically converting incident light and an A/D converter that AD-converts the electrical signal, the plurality of pixels configured to be capable of AD-converting a signal output from the light-receiving portion of a first pixel, among a predetermined plurality of pixels, using the A/D converter of another pixel, every said predetermined plurality of pixels, and the selection circuit selecting a pixel to AD-convert the electrical signal output from the light-receiving portion of the first pixel, every said predetermined plurality of pixels; and
a processing circuit that processes a digital signal output from the A/D converter of each pixel,
wherein the A/D converters of the predetermined plurality of pixels carry out the AD conversion in parallel, and
wherein the light-receiving portion of the first pixel includes two photoelectric conversion portions that photoelectrically convert incident light;
the selection circuit:
selects the A/D converter of the first pixel as the A/D converter for AD-converting the electrical signals obtained from the two photoelectric conversion portions of the first pixel, by controlling the electrical signals output from the light-receiving portion to be AD-converted by the A/D converter on a pixel-by-pixel basis, in a first mode, and
selects the A/D converter of the first pixel as the A/D converter for AD-converting the electrical signal obtained from one of the two photoelectric conversion portions, and selects the A/D converter of a second pixel, which is different from the first pixel, as the A/D converter for AD-converting the electrical signal obtained from the other of the two photoelectric conversion portions, in a second mode; and
the image sensor further comprises a control circuit that carries out control so that in the second mode, the electrical signal output from the light-receiving portion of the second pixel is not input to the A/D converter.

8. The image capturing apparatus according to claim 7, wherein the processing circuit detects a focus state on the basis of the digital signals.

9. The image capturing apparatus according to claim 7, wherein the processing circuit carries out a process of averaging the digital signals.

10. The image capturing apparatus according to claim 7, wherein the processing circuit carries out a process of expanding the dynamic range using the digital signals.

11. An image capturing apparatus comprising:
an image sensor including a plurality of pixels and a selection circuit, each pixel including a light-receiving portion that outputs an electrical signal obtained by photoelectrically converting incident light and an A/D converter that AD-converts the electrical signal, the plurality of pixels configured to be capable of AD-converting a signal output from the light-receiving portion of a first pixel, among a predetermined plurality of pixels, using the A/D converter of another pixel, every said predetermined plurality of pixels, and the selection circuit selecting a pixel to AD-convert the electrical signal output from the light-receiving portion of the first pixel, every said predetermined plurality of pixels; and
a processing circuit that processes a digital signal output from the A/D converter of each pixel,
wherein the A/D converters of the predetermined plurality of pixels carry out the AD conversion in parallel, and
wherein the selection circuit:
selects the A/D converter of the first pixel as the A/D converter for AD-converting the electrical signal obtained from the first pixel by controlling the electrical signal output from the light-receiving portion to be AD-converted by the A/D converter on a pixel-by-pixel basis, in a first mode, and
selects the A/D converter of the first pixel and the A/D converter of a second pixel, which is different from the first pixel, in a second mode; and
the image sensor further comprises a control circuit that carries out control so that in the second mode, the electrical signal output from the light-receiving portion of the second pixel is not input to the A/D converter.

* * * * *